US00RE50970E

(19) United States
(12) Reissued Patent
Koevoets et al.

(10) Patent Number: US RE50,970 E
(45) **Date of Reissued Patent: *Jul. 28, 2026**

(54) LITHOGRAPHIC APPARATUS AND AN OBJECT POSITIONING SYSTEM

(71) Applicant: ASML Netherlands B.V., Veldhoven (NL)

(72) Inventors: Adrianus Hendrik Koevoets, Mierlo (NL); Christianus Wilhelmus Johannes Berendsen, Roermond (NL); Rogier Hendrikus Magdalena Cortie, Ittervoort (NL); Jim Vincent Overkamp, Eindhoven (NL); Patricius Jacobus Neefs, Raamsdonksveer (NL); Putra Saputra, Delft (NL); Ruud Hendrikus Martinus Johannes Bloks, Helmond (NL); Michael Johannes Hendrika Wilhelmina Renders, Eindhoven (NL); Johan Gertrudis Cornelis Kunnen, Weert (NL); Thibault Simon Mathieu Laurent, Eindhoven (NL)

(73) Assignee: ASML NETHERLANDS B.V., Veldhoven (NL)

( * ) Notice: This patent is subject to a terminal disclaimer.

(21) Appl. No.: 17/867,226

(22) Filed: Jul. 18, 2022

Related U.S. Patent Documents

Reissue of:
(64) Patent No.: 9,939,738
Issued: Apr. 10, 2018
Appl. No.: 15/329,536
PCT Filed: Jul. 16, 2015
PCT No.: PCT/EP2015/066314
§ 371 (c)(1),
(2) Date: Jan. 26, 2017
PCT Pub. No.: WO2016/020170
PCT Pub. Date: Feb. 11, 2016

U.S. Applications:
(63) Continuation of application No. 16/590,895, filed on Oct. 2, 2019, now Pat. No. Re. 49,142, which is an
(Continued)

(30) Foreign Application Priority Data

Aug. 6, 2014 (EP) ..... 14179972

(51) Int. Cl.
*G03F 7/20* (2006.01)
*G03F 7/00* (2006.01)

(52) U.S. Cl.
CPC ..... *G03F 7/70725* (2013.01); *G03F 7/70341* (2013.01); *G03F 7/70783* (2013.01); *G03F 7/70875* (2013.01)

(58) Field of Classification Search
CPC . G03F 7/0725; G03F 7/70875; G03F 7/70266
(Continued)

(56) References Cited

U.S. PATENT DOCUMENTS 6,952,253 B2 10/2005 Lof et al.
7,213,963 B2 5/2007 Lof et al.
(Continued)

FOREIGN PATENT DOCUMENTS

EP 1 420 298 5/2004
EP 1 804 122 7/2007
(Continued)

OTHER PUBLICATIONS

International Search Report and Written Opinion mailed Oct. 22, 2015 in corresponding International Patent Application No. PCT/EP2015/066314.

(Continued)

*Primary Examiner* — My Trang Ton
(74) *Attorney, Agent, or Firm* — Pillsbury Winthrop Shaw Pittman, LLP

(57) ABSTRACT

A lithographic apparatus comprising an object table which carries an object. The lithographic apparatus may further comprise at least one sensor as part of a measurement system to measure a characteristic of the object table, the environment surrounding the lithographic apparatus or another component of the lithographic apparatus. The measured characteristic may be used to estimate the deformation of the object due to varying loads during operation of the lithographic apparatus, for example varying loads induced by a two-phase flow in a channel formed within the object table. Additionally, or alternatively, the lithographic apparatus comprises a predictor to estimate the deformation of the object based on a model. The positioning of the object table carrying the object can be controlled based on the estimated deformation. The positioning of a projection beam, used to pattern a substrate, can be controlled relative to the object, to alter the position of the pattern and/or the projection beam on the substrate, based on the estimated deformation.

20 Claims, 9 Drawing Sheets

Related U.S. Application Data application for the reissue of Pat. No. 9,939,738, filed as application No. PCT/EP2015/066314 on Jul. 16, 2015.

(58) Field of Classification Search
USPC ..... 355/30, 53, 72
See application file for complete search history.

(56) References Cited

U.S. PATENT DOCUMENTS

| | | | | |
|---|---|---|---|---|
| 7,462,429 | B2 | 12/2008 | Menchtchikov et al. | |
| 8,564,763 | B2 | 10/2013 | Jacobs et al. | |
| 8,879,043 | B2 * | 11/2014 | Nagasaka | G03F 7/70341 355/72 |
| 9,141,004 | B2 | 9/2015 | Vermeulen et al. | |
| 9,298,107 | B2 | 3/2016 | Laurent et al. | |
| 9,329,501 | B2 | 5/2016 | Huang et al. | |
| 9,417,533 | B2 | 8/2016 | Prosyentsov et al. | |
| 2004/0080734 | A1 | 4/2004 | Taniguchi | |
| 2004/0207824 | A1 | 10/2004 | Lof et al. | |
| 2005/0140962 | A1 | 6/2005 | Ottens et al. | |
| 2005/0264778 | A1 | 12/2005 | Lof et al. | |
| 2006/0170902 | A1 | 8/2006 | Won | |
| 2006/0273267 | A1 | 12/2006 | Maeda | |
| 2007/0082280 | A1 | 4/2007 | Menchtchikov et al. | |
| 2007/0153244 | A1 | 7/2007 | Zaal et al. | |
| 2009/0279061 | A1 | 11/2009 | Jacobs et al. | |
| 2010/0045949 | A1 | 2/2010 | Nakano et al. | |
| 2011/0026004 | A1 | 2/2011 | Van Eijk et al. | |
| 2011/0194084 | A1 | 8/2011 | Riepen et al. | |
| 2011/0222032 | A1 | 9/2011 | Kate et al. | |
| 2012/0013865 | A1 | 1/2012 | Laurent et al. | |
| 2012/0133914 | A1 | 5/2012 | Prosyentsov et al. | |
| 2012/0156810 | A1 | 6/2012 | Fukazawa | |
| 2012/0249987 | A1 | 10/2012 | Vermeulen et al. | |
| 2012/0281192 | A1 | 11/2012 | De Laat | |
| 2012/0327386 | A1 | 12/2012 | Huang et al. | |
| 2014/0340659 | A1 * | 11/2014 | Van Schoot | G03F 7/70266 355/30 |
| 2015/0049317 | A1 * | 2/2015 | Mishima | G03F 7/0002 355/67 |
| 2016/0011525 | A1 | 1/2016 | Phillips | |

FOREIGN PATENT DOCUMENTS

| | | | |
|---|---|---|---|
| JP | 2003-059807 | | 2/2003 |
| JP | 2003-059807 | A | 2/2003 |
| JP | 2007-515799 | | 6/2007 |
| JP | 2007-515799 | A | 6/2007 |
| JP | 2007-180555 | | 7/2007 |
| JP | 2007-180555 | A | 7/2007 |
| JP | 2007-194618 | | 8/2007 |
| JP | 2007-194618 | A | 8/2007 |
| JP | 2010-129766 | | 6/2010 |
| JP | 2010-129766 | A | 6/2010 |
| JP | 2011-035392 | | 2/2011 |
| JP | 2011-035392 | A | 2/2011 |
| JP | 2011-176308 | | 9/2011 |
| JP | 2011-176308 | A | 9/2011 |
| JP | 2011-192992 | | 9/2011 |
| JP | 2011-192992 | A | 9/2011 |
| JP | 2012-023371 | | 2/2012 |
| JP | 2012-023371 | A | 2/2012 |
| JP | 2012-084793 | | 4/2012 |
| JP | 2012-084793 | A | 4/2012 |
| WO | 2013/178438 | | 12/2013 |
| WO | 2013178438 | A1 | 12/2013 |
| WO | 2014044670 | | 3/2014 |
| WO | 2014044670 | A1 | 3/2014 |
| WO | 2014053296 | | 4/2014 |
| WO | 2014063296 | A1 | 4/2014 |

OTHER PUBLICATIONS

Notice of Reasons for Rejection issued in corresponding Japanese Patent Application No. 2017-501167 dated Feb. 2, 2018.
International Search Report and Written Opinion dated Oct. 22, 2015 in corresponding International Patent Application No. PCT/EP2015/066314.
Disclosed Anonymously, "Research Disclosure," Research Disclosure database No. 587047, vol. 587, No. 47, pp. 1-9 (Mar. 1, 2013).
Notice of Reasons issued in corresponding Japanese Patent Application No. 2017-501167 dated Feb. 2, 2018 with English translation.

* cited by examiner

LITHOGRAPHIC APPARATUS AND AN OBJECT POSITIONING SYSTEM

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

CROSS-REFERENCE TO RELATED APPLICATIONS

[This] *The present application is a continuation reissue of application Ser. No. 16/590,895, filed Oct. 2, 2019 (now allowed), which is incorporated herein in its entirety by reference, which is a reissue application of U.S. Pat. No. 9,939,738 that issued from U.S. patent application Ser. No. 15/329,536, filed Jan. 26, 2017, which* application is the U.S. national phase entry of PCT patent application no. PCT/EP2015/066314, which was filed on Jul. 16, 2015, which claims the benefit of priority of European patent application no. 14179972.6, which was filed on Aug. 6, 2014, and which is incorporated herein in its entirety by reference.

FIELD

The present invention relates to a lithographic apparatus and a method of manufacturing a lithographic apparatus.

BACKGROUND

A lithographic apparatus is a machine that applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a projection beam in a given direction (the "scanning"-direction) while synchronously scanning the substrate parallel or anti parallel to this direction. It is also possible to transfer the pattern from the patterning device to the substrate by imprinting the pattern onto the substrate.

In an immersion apparatus, immersion fluid is handled by a fluid handling system, device structure or apparatus. In an embodiment the fluid handling system may supply immersion fluid and therefore be a fluid supply system. In an embodiment the fluid handling system may at least partly confine immersion fluid and thereby be a fluid confinement system. In an embodiment the fluid handling system may provide a barrier to immersion fluid and thereby be a barrier member, such as a fluid confinement structure. In an embodiment the fluid handling system may create or use a flow of gas, for example to help in controlling the flow and/or the position of the immersion fluid. The flow of gas may form a seal to confine the immersion fluid so the fluid handling structure may be referred to as a seal member; such a seal member may be a fluid confinement structure. In an embodiment, immersion liquid is used as the immersion fluid. In that case the fluid handling system may be a liquid handling system. In reference to the aforementioned description, reference in this paragraph to a feature defined with respect to fluid may be understood to include a feature defined with respect to liquid.

Handling immersion liquid in a lithographic apparatus brings with it one or more problems of liquid handling. A gap normally exists between an object, (e.g., a substrate and/or a sensor) and a table (e.g. a substrate table or a measurement table) around the edge of the object. U.S. patent application publication U.S. 2005-0264778, discloses filling that gap with material or providing a liquid source or low pressure source to deliberately fill the gap with liquid in order to avoid bubble inclusion as the gap passes under the liquid supply system and/or to remove any liquid which does enter the gap.

Liquid from a gap between an edge of an object and a table on which the object is positioned may be removed through a channel. When the liquid is removed, gas may also be removed through the channel. A two-phase flow of liquid and gas may pass through the channel. Such a channel for two-phase flow may be present in other parts of the lithographic apparatus, for example in a liquid confinement system. Such a two-phase flow can lead to undesirable temperature changes in the component that the channel is formed in, or other nearby components. Temperature changes and/or any other load imposed by the two-phase flow on an object containing such a channel will induce deformation of the object.

In an embodiment, the lithographic apparatus comprises one or more objects that need to be positioned, e.g. a substrate table or a support structure. In an embodiment a specific point, referred to as the point of interest, on the object needs to be positioned accurately. For example, the point of interest may be a target portion on the substrate. However, it may not be possible to directly measure the position of the point of interest. In an embodiment, the position of another point, referred to as the measured point, is measured. The position of the point of interest relative to the measured point is assumed. The point of interest and the measured point may be on the same object. Alternatively, the point of interest and the measured point may be on different objects. For example, the point of interest may be on the object and the measured point may be on an object table, the object table being used to carry the object. Temperature variation and/or any other load imposed can cause deformation of the object and/or the object table leading to changes in the position of the point of interest relative to the measured point. As such, the deformation may cause errors in the positioning of the point of interest.

The same principle applies to many objects and object tables in the lithographic apparatus, including components for measuring displacement of parts of the lithographic apparatus. Any deformation in measuring components will lead to inaccurate measurements which may change the position to which a point of interest is moved which may cause errors in the positioning of the point of interest.

SUMMARY

It is desirable, for example, to account for the undesirable deformation of the object. Undesirable deformation may be caused in many different ways, for example, by a two-phase flow through a channel in a lithographic apparatus. For example, if the object table is a substrate table and the object is a substrate to be exposed, a small deformation of the substrate table may deform the substrate and/or alter the position of certain points on the substrate. In this way, deformation of the substrate table WT may cause, or increase, an overlay error and/or a focus error in the patterning of the substrate. Undesirable deformation may also be caused by thermal variation and/or a varying undesirable load which can lead to overlay error, focus error and/or imaging error.

According to an aspect of the invention, there is provided a lithographic apparatus comprising: an object table which carries an object, the object table being movable in at least one direction, wherein a varying load acts on the object and/or object table, during operational use, causing deformation of a part of the object; and a control system to control the movement of the object table in the at least one direction based on a quantity representative of the deformation of the part of the object.

According to an aspect, there is provided a lithographic apparatus comprising: an object table which carries an object, wherein a varying load acts on the object and/or object table, during operational use, causing deformation of a part of the object; a projection system configured for projecting a pattern on a patterning device onto the object using a pattern, wherein placement of the projection beam on the object is movable in at least one direction relative to the object; and a control system to control the placement of the projection beam relative to the object based on a quantity representative of the deformation of the part of the object.

According to an aspect, there is provided a lithographic apparatus comprising: an object table which carries at least part of a displacement measurement system, the object table being movable in at least one direction, a displacement measurement system comprising a displacement sensor and a target, wherein a varying load acts on the displacement sensor and/or the target, during operational use, causing deformation of a part of the displacement sensor and/or the target respectively; and a control system to control the movement of the object table in the at least one direction based on an output from the displacement measurement system and a quantity representative of the deformation of the part of the displacement sensor and/or the target respectively.

According to an aspect, there is provided an object positioning system comprising: an object table which carries an object, the object table being movable in at least one direction, wherein a varying load acts on the object and/or object table, during operational use, causing deformation of a part of the object; and a control system to control the movement of the object table in the at least one direction based on a quantity representative of the deformation of the part of the object.

According to an aspect, there is provided an object positioning system comprising: an object table which carries an object, wherein a varying load acts on the object and/or object table, during operational use, causing deformation of a part of the object; a projection system configured for projecting a pattern on a patterning device onto the object using a pattern, wherein placement of the projection beam on the object is movable in at least one direction relative to the object and a control system to control the placement of the projection beam relative to the object based on a quantity representative of the deformation of the part of the object.

According to an aspect there is provided an object positioning system comprising: an object table which carries at least part of a displacement measurement system, the object table being movable in at least one direction, a displacement measurement system comprising a displacement sensor and a target, wherein a varying load acts on the displacement sensor and/or the target, during operational use, causing deformation of a part of the displacement sensor and/or the target respectively; and a control system to control the movement of the object table in the at least one direction based on an output from the displacement measurement system and a quantity representative of the deformation of the part of the displacement sensor and/or the target respectively.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
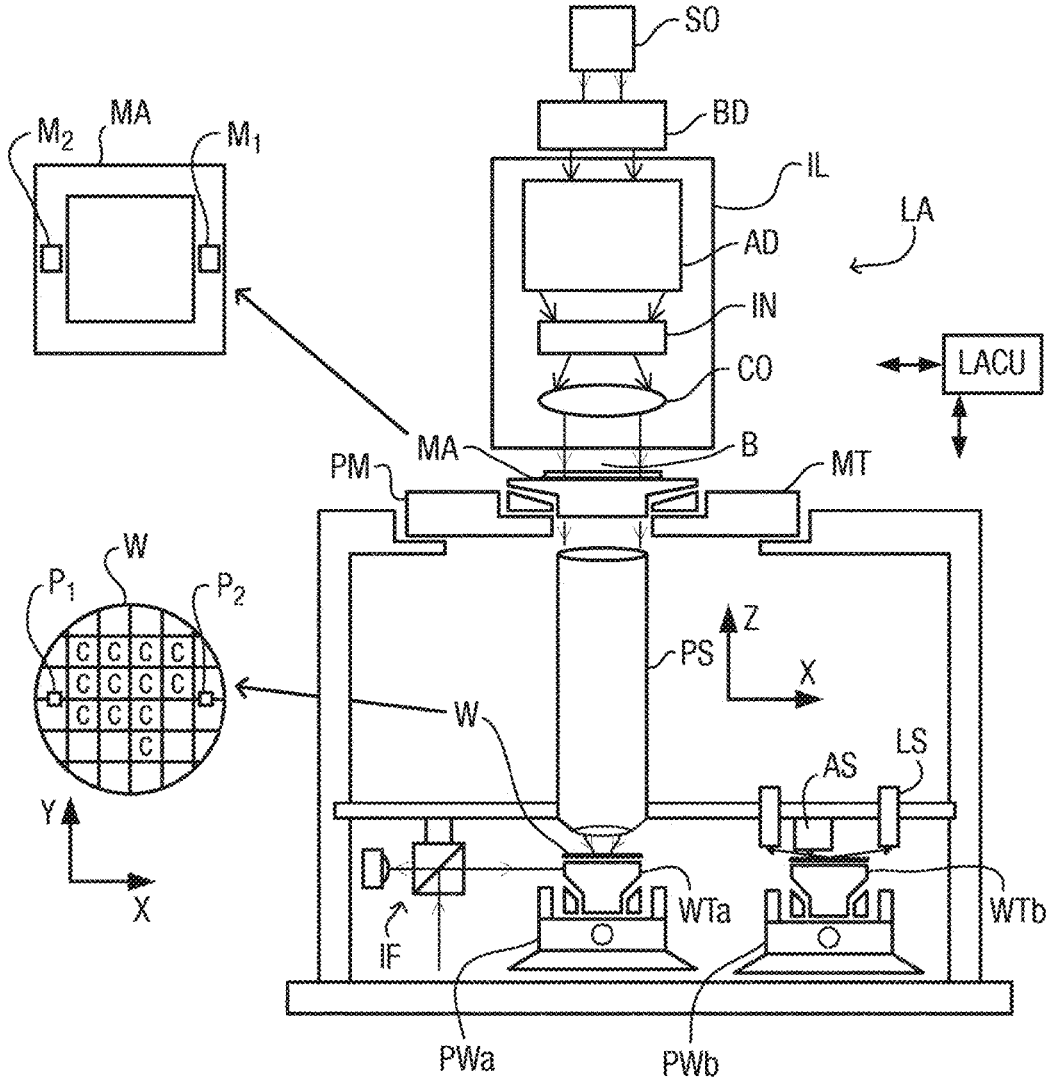
FIG. 1 depicts a lithographic apparatus according to an embodiment of the invention.

FIG. 1 schematically depicts a lithographic apparatus LA according to an embodiment of the invention. The apparatus includes an illumination system (illuminator) IL configured to condition a projection beam B (e.g. UV radiation or any other suitable radiation), a support structure (e.g. a mask support structure/mask table) MT constructed to support a patterning device (e.g. a mask) MA and connected to a first positioning device PM configured to accurately position the patterning device MA in accordance with certain parameters. The apparatus also includes a substrate table (e.g. a wafer table) WT or "substrate support" constructed to hold a substrate (e.g. a resist-coated wafer) W and connected to a second positioning device PW configured to accurately position the substrate W in accordance with certain parameters. The apparatus further includes a projection system (e.g. a refractive projection lens system) PS configured to project a pattern imparted to the projection beam B by patterning device MA onto a target portion C (e.g. including one or more dies) of the substrate W. The projection beam B is a radiation beam.

The illumination system IL may include various types of optical components, such as refractive, reflective, magnetic, electromagnetic, electrostatic or other types of optical components, or any combination thereof, for directing, shaping, or controlling radiation.

The support structure MT supports, i.e. bears the weight of, the patterning device MA. The support structure MT holds the patterning device MA in a manner that depends on the orientation of the patterning device MA, the design of the lithographic apparatus LA, and other conditions, such as for example, whether or not the patterning device MA is held in a vacuum environment. The support structure MT can use mechanical, vacuum, electrostatic or other clamping techniques to hold the patterning device MA. The support structure MT may be a frame or a table, for example, which may be fixed or movable as required. The support structure MT may ensure that the patterning device MA is at a desired position, for example with respect to the projection system PS. Any use of the terms "reticle" or "mask" herein may be considered synonymous with the more general term "patterning device."

The term "patterning device" used herein should be broadly interpreted as referring to any device that can be used to impart a projection beam B with a pattern in its cross-section so as to create a pattern in a target portion C of the substrate W. It should be noted that the pattern imparted to the projection beam B may not exactly correspond to the desired pattern in the target portion C of the substrate W, for example if the pattern includes phase-shifting features or so called assist features. Generally, the pattern imparted to the projection beam B will correspond to a particular functional layer in a device being created in the target portion C, such as an integrated circuit.

The patterning device MA may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable minor array employs a matrix arrangement of small mirrors, each of which can be individually tilted so as to reflect an incoming projection beam in different directions. The tilted mirrors impart a pattern in a projection beam which is reflected by the minor matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the lithographic apparatus LA is of a transmissive type (e.g. employing a transmissive mask). Alternatively, the lithographic apparatus LA may be of a reflective type (e.g. employing a programmable minor array of a type as referred to above, or employing a reflective mask).

The lithographic apparatus LA may be of a type having two (dual stage) or more substrate tables WT (and/or two or more support structures MT). In such "multiple stage" machines the additional tables may be used in parallel, or preparatory steps may be carried out on one or more tables while one or more other tables are being used for exposure. The lithographic apparatus LA may comprise a measurement table (not depicted in figure) that is arranged to hold measurement equipment, such as sensors to measure properties of the projection system PS. In an embodiment, the measurement table is not configured to hold a substrate W. The two substrate tables WTa and WTb in the example of FIG. 1 are an illustration of a dual stage lithographic apparatus LA.

The lithographic apparatus LA may also be of a type wherein at least a portion of the substrate W may be covered by a liquid having a relatively high refractive index, e.g. water, so as to fill a space between the projection system PS and the substrate W. An immersion liquid may also be applied to other spaces in the lithographic apparatus LA, for example, between the patterning device MA and the projection system PS Immersion techniques can be used to increase the numerical aperture of projection systems PS. The term "immersion" as used herein does not mean that a structure, such as a substrate W, must be submerged in liquid, but rather only means that a liquid is located between the projection system PS and the substrate W during exposure.

Referring to FIG. 1, the illuminator IL receives a projection beam B from a radiation source SO. The source SO and the lithographic apparatus LA may be separate entities, for example when the source SO is an excimer laser. In such cases, the source SO is not considered to form part of the lithographic apparatus LA and the projection beam B is passed from the source SO to the illuminator IL with the aid of a beam delivery system BD including, for example, suitable directing minors and/or a beam expander. In other cases the source SO may be an integral part of the lithographic apparatus LA, for example when the source SO is a mercury lamp. The source SO and the illuminator IL, together with the beam delivery system BD if required, may be referred to as a radiation system.

The illuminator IL may include an adjuster AD configured to adjust the angular intensity distribution of the projection beam B. Generally, at least the outer and/or inner radial extent (commonly referred to as a-outer and a-inner, respectively) of the intensity distribution in a pupil plane of the illuminator IL can be adjusted. In addition, the illuminator IL may include various other components, such as an integrator IN and a condenser CO. The illuminator IL may be used to condition the projection beam B, to have a desired uniformity and intensity distribution in its cross-section. Similar to the source SO, the illuminator IL may or may not be considered to form part of the lithographic apparatus LA. For example, the illuminator IL may be an integral part of the lithographic apparatus LA or may be a separate entity from the lithographic apparatus LA. In the latter case, the lithographic apparatus LA may be configured to allow the illuminator IL to be mounted thereon. Optionally, the illuminator IL is detachable and may be separately provided (for example, by the lithographic apparatus LA manufacturer or another supplier).

The projection beam B is incident on the patterning device MA, which is held on the support structure MT, and is patterned by the patterning device MA. Having traversed the patterning device MA, the projection beam B passes through the projection system PS, which focuses the beam onto a target portion C of the substrate W. The second positioning device PW may comprise two positioners PWa, PWb. With the aid of the second positioning device PW and a position sensor IF (comprising e.g. an interferometric device, linear encoder or capacitive sensor), the substrate table WTa/WTb can be moved accurately, e.g. so as to position different target portions C in the path of the projection beam B. For example, positioner PWa may be used to help position substrate table WTa and positioner PWb may be used to help position substrate table WTb, or vice versa. Similarly, the first positioning device PM and another position sensor (which is not explicitly depicted in FIG. 1) can be used to accurately position the patterning device MA with respect to the path of the projection beam B, e.g. after mechanical retrieval from a mask library, or during a scan.

In general, movement of the patterning device MA may be realized with the aid of a long-stroke module and a short-stroke module, which both form part of the first positioning device PM. The long-stroke module is arranged to move the short-stroke module over a long range with limited precision. The short-stroke module is arranged to move the patterning device MA over a short range relative to the long-stroke module with a high precision. Similarly, movement of the substrate table WTa/WTb may be realized using a long-stroke module and a short-stroke module, which both form part of the second positioning device PW. In the case of a stepper (as opposed to a scanner) the support structure MT may be connected to a short-stroke actuator only, or may be fixed.

Patterning device MA and substrate W may be aligned using mask alignment marks M1, M2 and substrate alignment marks P1, P2. Although the substrate alignment marks P1, P2 as illustrated occupy dedicated target portions C, they may be located in spaces between target portions C. Marks located in spaces between the target portions C are known as scribe-lane alignment marks. Similarly, in situations in which more than one die is provided on the patterning device MA, the mask alignment marks M1, M2 may be located between the dies.

The depicted lithographic apparatus LA may be used to expose a substrate W by using the lithographic apparatus LA in a variety of modes. For example, an exposure can be formed in a scan mode wherein the velocity and direction of the substrate table WTa/WTb relative to the support structure MT may be determined by the (de-)magnification and image reversal characteristics of the projection system PS. In scan mode, the maximum size of the exposure field limits the width (in the non-scanning direction) of the target portion C in a single dynamic exposure, whereas the length of the scanning motion determines the height (in the scanning direction) of the target portion C.

The lithographic apparatus LA of FIG. 1 is of a so-called dual stage type which has two substrate tables WTa and WTb and two stations—an exposure station and a measurement station—between which the substrate tables WT can be exchanged. While one substrate W on one substrate table (e.g., WTa) is being exposed at the exposure station, another substrate W can be loaded onto the other substrate table WT (e.g., WTb) at the measurement station so that various preparatory steps may be carried out. The preparatory steps may include mapping the surface of the substrate W using a level sensor LS and measuring the position of substrate alignment marks P1, P2 on the substrate W using an alignment sensor AS. This enables a substantial increase in the throughput of the lithographic apparatus LA. If the position sensor IF is not capable of measuring the position of the substrate table WT while it is at the measurement station, as well as at the exposure station, a second position sensor (not depicted in figure) may be provided to enable the positions of the substrate table WT to be tracked at both stations. Instead of two substrate tables WTa and WTb, the lithographic apparatus LA may comprise one substrate table WT and a measurement table that is arranged to hold measurement equipment, such as sensors to measure properties of the projection system PS.

The lithographic apparatus LA further includes a lithographic apparatus control unit LACU which controls all the movements and measurements of the various actuators and sensors described. The lithographic apparatus control unit LACU also includes signal processing and data processing capacity to implement desired calculations relevant to the operation of the lithographic apparatus LA. In practice, the lithographic apparatus control unit LACU will be realized as a system of many sub-units, each handling the real-time data acquisition, processing and control of a subsystem or component within the lithographic apparatus LA. For example, one processing subsystem may be dedicated to servo control of the second positioning device PW. Separate units may handle different actuators, or different axes. Another sub-unit might be dedicated to the readout of the position sensor IF. Overall control of the lithographic apparatus LA may be controlled by a central processing unit. The central processing unit may communicate with the sub-units, with operators and with other apparatuses involved in the lithographic manufacturing process.

Arrangements for providing liquid between a final element of the projection system PS and the substrate W can be classed into three general categories. These are the bath type arrangement, the so-called localized immersion system and the all-wet immersion system. In a bath type arrangement substantially the whole of the substrate W and optionally part of the substrate table WT is submersed in a bath of liquid.

Figure 2:
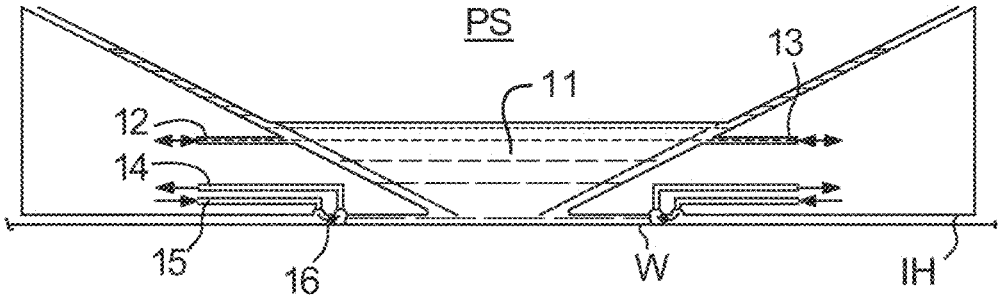
FIG. 2 depicts a liquid supply system for use in a lithographic apparatus according to an embodiment.

An arrangement which has been proposed is to provide the liquid supply system with a liquid confinement structure which extends along at least a part of a boundary of the space between the final element of the projection system PS and the substrate W, substrate table WT or both. Such an arrangement is illustrated in FIG. 2. The arrangement illustrated in FIG. 2 and described below may be applied to the lithographic apparatus LA described above and illustrated in FIG. 1.

FIG. 2 schematically depicts a localized liquid supply system or fluid handling system with a liquid confinement structure IH, which extends along at least a part of a boundary of the space between the final element of the projection system PS and the substrate table WT or substrate W. (Reference in the following text to surface of the substrate W also refers in addition or in the alternative to a surface of the substrate table WT, unless expressly stated otherwise.) In an embodiment, a seal is formed between the liquid confinement structure IH and the surface of the substrate W and which may be a contactless seal such as a gas seal 16 (such a system with a gas seal is disclosed in European patent application publication no. EP-A-1,420,298) or a liquid seal.

The liquid confinement structure IH at least partly contains liquid in the space 11 between the final element of the projection system PS and the substrate W. The space 11 is at least partly formed by the liquid confinement structure IH positioned below and surrounding the final element of the projection system PS. Liquid is brought into the space below the projection system PS and within the liquid confinement structure IH by liquid inlet 12. The liquid may be removed by liquid outlet 13. The liquid inlet 12 and the liquid outlet 13 may be interchangeable, and both the liquid inlet 12 and the liquid outlet 13 may be used as a liquid inlet 12, or as a liquid outlet 13 at the same time.

The liquid may be contained in the space 11 by the gas seal 16 which, during use, is formed between the bottom of the liquid confinement structure IH and the surface of the substrate W. The gas in the gas seal 16 is provided under pressure via gas inlet 15 to the gap between the liquid confinement structure IH and substrate W. The gas is extracted via a channel associated with gas outlet 14. The overpressure on the gas inlet 15, vacuum level on the outlet 14 and geometry of the gap are arranged so that the gas seal 16 is formed by a high-velocity gas flow inwardly that confines the liquid. The high-velocity gas flow exerts a force on the liquid between the confinement structure IH and the substrate W. The force of the high-velocity gas flow contains the liquid in space 11. Such a system is disclosed in United States patent application publication no. US 2004-0207824, which is hereby incorporated by reference in its entirety. In an embodiment, the liquid confinement structure IH does not have the gas seal 16.

Figure 4:
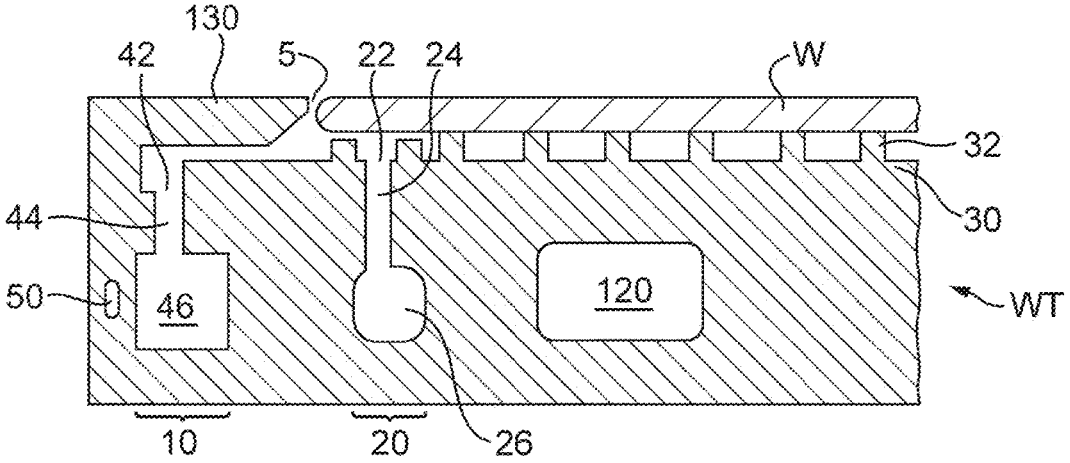
FIG. 4 depicts, in cross-section, a part of a substrate table of an embodiment.

In a localized liquid supply system, the substrate W is moved under the projection system PS and the liquid confinement structure IH. An edge of the substrate W (or other object) will pass under the space 11 at certain times. For example, when an edge of the substrate W is to be imaged, or when a sensor on the substrate table WT (or on a measurement table) is to be imaged, or when the substrate table WT is to be moved such that a dummy substrate, or so-called closing plate, can be positioned under the liquid supply system to enable, for example, substrate swap to take place. When the edge of an object passes under space 11, liquid may leak into the gap at the edge of the object. For example, FIG. 4 shows a gap 5 between the substrate W and substrate table WT. This liquid may be forced in under hydrostatic or hydrodynamic pressure or the force of a gas knife or other gas flow creating device.

Figure 3:
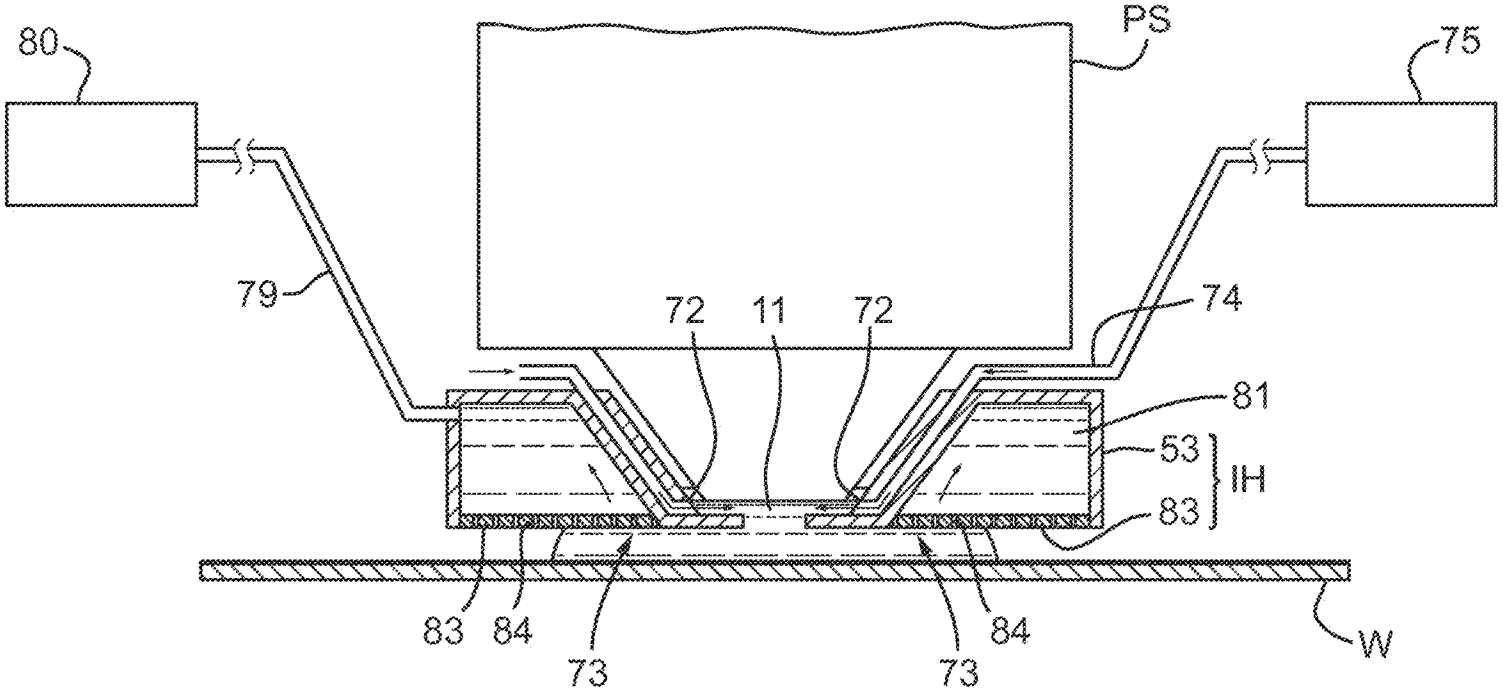
FIG. 3 is a side cross sectional view that depicts a further liquid supply system according to an embodiment.

FIG. 3 is a side cross sectional view that depicts a further liquid supply system or fluid handling system according to an embodiment. The arrangement illustrated in FIG. 3 and described below may be applied to the lithographic apparatus LA described above and illustrated in FIG. 1. The liquid supply system is provided with a liquid confinement structure IH, which extends along at least a part of a boundary of the space between the final element of the projection system PS and the substrate table WT or substrate W. (Reference in the following text to surface of the substrate W also refers in addition or in the alternative to a surface of the substrate table WT, unless expressly stated otherwise.)

The liquid confinement structure IH at least partly contains liquid in the space 11 between the final element of the projection system PS and the substrate W and/or substrate table WT. The space 11 is at least partly formed by the liquid confinement structure IH positioned below and surrounding the final element of the projection system PS. In an embodiment, the liquid confinement structure IH comprises a main body member 53 and a porous member 83. The porous member 83 is plate shaped and has a plurality of holes 84 (i.e., openings or pores). In an embodiment, the porous member 83 is a mesh plate wherein numerous small holes 84 are formed in a mesh. Such a system is disclosed in United States patent application publication no. US 2010/0045949 A1.

The main body member 53 comprises supply ports 72, which are capable of supplying the liquid to the space 11, and a recovery port 73, which is capable of recovering the liquid from the space 11. The supply ports 72 are connected to a liquid supply apparatus 75 via passageways 74. The liquid supply apparatus 75 is capable of supplying the liquid to the supply ports 72. The liquid that is fed from the liquid supply apparatus 75 is supplied to each of the supply ports 72 through the corresponding passageway 74. The supply ports 72 are disposed in the vicinity of the optical path at prescribed positions of the main body member 53 that face the optical path. The recovery port 73 is capable of recovering the liquid from the space 11. The recovery port 73 is connected to a liquid recovery apparatus 80 via a passageway 79. The liquid recovery apparatus 80 comprises a vacuum system and is capable of recovering the liquid by sucking it via the recovery port 73. The liquid recovery apparatus 80 recovers the liquid recovered via the recovery port 73 through the passageway 79. The porous member 83 is disposed in the recovery port 73.

In an embodiment, to form the space 11 with the liquid between the projection system PS and the liquid confinement structure IH on one side and the substrate W on the other side, liquid is supplied from the supply ports 72 to the space 11 and the pressure in a recovery chamber 81 in the liquid confinement structure IH is adjusted to a negative pressure so as to recover the liquid via the holes 84 (i.e., the recovery port 73) of the porous member 83. Performing the liquid supply operation using the supply ports 72 and the liquid recovery operation using the porous member 83 forms the space 11 between the projection system PS and the liquid confinement structure IH and the substrate W.

The substrate W beneath a liquid supply system, wherein the liquid supply system may be as described above, e.g. a localized liquid supply system, may be moved beneath the liquid confinement structure IH. The substrate table WTa/WTb supporting the substrate W may be movable to position the substrate W. The support structure MT and the substrate tables WTa/WTb are examples of an object table within the lithographic apparatus LA that may need to be positioned accurately relative to a reference, e.g. the projection system PS.

In order to position an object table, carrying an object, relative to a reference within the lithographic apparatus LA, the lithographic apparatus LA comprises at least one object positioning system according to the invention, which will be described in more detail below.

Although one or more embodiments of the invention will be described below in relation to a channel formed between a substrate table WT and the edge of a substrate W, the one or more embodiments are equally applicable to a channel for the passage therethrough of a two-phase flow formed within other components including, but not limited to, a support structure (e.g. mask table) MT. Thus, any reference below to the substrate table WT should be considered to be synonymous with any other components within which a channel is formed for the passage therethrough for a two-phase flow and which is used on an object table. Similarly, a substrate W is described below in combination with the substrate table WT. The substrate W should be considered to be synonymous with any other components within a lithographic apparatus LA which is carried by an object table.

FIG. 4 illustrates part of a lithographic apparatus LA according to an embodiment of the present invention. The arrangement illustrated in FIG. 4 and described below may be applied to the lithographic apparatus LA described above and illustrated in FIG. 1. FIG. 4 is a cross-section through a substrate table WT and a substrate W. A gap 5 exists between an edge of the substrate W and an edge of the substrate table WT. When the edge of the substrate W is being imaged or at other times such as when the substrate W first moves under the projection system PS (as described above), the space 11 filled with liquid by the liquid supply system (e.g., the liquid confinement structure IH) will pass at least partly over the gap 5 between the edge of the substrate W and the edge of the substrate table WT. This can result in liquid from the space 11 entering the gap 5.

The substrate W is held by a substrate holder 30 (e.g. a pimple or burl table) comprising one or more projections 32 (i.e., burls) on the substrate table WT. The substrate holder 30 is an example of an object holder. Another example of an object holder is a mask holder. The object holder is an optional part of an object table. An object table is for carrying an object. An under-pressure applied between the substrate W and the substrate table WT helps ensure that the substrate W is held firmly in place. However, if liquid gets between the substrate W and the substrate table WT this can lead to difficulties, particularly when unloading the substrate W.

In order to deal with the liquid entering gap 5 at least one drain 10, 20 is provided at the edge of the substrate W to remove liquid which enters the gap 5. In the embodiment of FIG. 4 two drains 10, 20 are illustrated, though there may only be one drain or there could be more than two drains. In an embodiment, each of the first drain 10 and the second drain 20 is annular so that the whole periphery of the substrate W is surrounded.

A primary function of the first drain 10 (which is radially outward of the edge of the substrate W/substrate holder 30) is to help prevent bubbles of gas from entering the space 11 where the liquid enclosed by the liquid confinement structure IH is present. Such bubbles may deleteriously affect the imaging of the substrate W. The first drain 10 is present to help avoid gas in the gap 5 escaping into the space 11 in the liquid confinement structure IH. If gas does escape into the space 11, this can lead to a bubble which floats within the space 11. A bubble, if in the path of the projection beam, may lead to an imaging error. The first drain 10 is configured to remove gas from the gap 5 between the edge of the substrate W and the edge of the recess in the substrate table WT in which the substrate W is placed. The edge of the recess in the substrate table WT may be defined by a cover ring 130 which is optionally separate from a support body of the substrate table WT. The cover ring 130 may be shaped, in plan, as a ring and surrounds the outer edge of the substrate W. The first drain 10 extracts mostly gas (for example, between 20 and 100 normal liters per minute (Nl/min)) and only a small amount of immersion liquid (for example, about 10-20 ml/min). With such a two-phase flow, part of the immersion liquid evaporates, thus cooling down the substrate table WT surrounding the edge of the substrate W, i.e. evaporation of the two-phase flow causes a thermal load to be applied to the substrate table WT surrounding the channel. This can result in deformation of the substrate table WT and/or the substrate W, eventually leading to decreased overlay performance. The thermal load is an example of a varying load which may act on the object and/or object table.

The second drain 20 (which is radially inward of the edge of the substrate W/substrate holder 30) is provided to help prevent liquid which finds its way from the gap 5 to underneath the substrate W from preventing efficient release of the substrate W from the substrate table WT after imaging. The provision of the second drain 20 reduces or eliminates any problems which may occur due to liquid finding its way underneath the substrate W.

Both the first drain 10 and the second drain 20 remove liquid by way of an under-pressure. That is, both drains are connected via one or more outlets (not illustrated) to an under-pressure source. The under-pressure source effectively removes liquid which enters the first drain 10 and/or the second drain 20. However, the under-pressure source is also effective to draw gas in from outside of the gap 5 above the substrate table WT through the first drain 10 and/or the second drain 20 and out through the outlets. This flow of liquid and gas is not constant or uniform around the periphery of either of the first drain 10 or the second drain 20 during use of the immersion apparatus. One or more measures may be taken to only connect the outlets to the under-pressure source when there is a chance of liquid entering the gap 5, but there is still the risk of a variable thermal load (e.g. variable in time and/or space) being applied to the substrate table WT because of the varying amount of gas and/or liquid which passes through each of the first drain 10 and the second drain 20.

Any flows of gas and liquid which are variable in time and/or space result in different rates of evaporation of liquid in each of the first drain 10 and the second drain 20 thereby leading to variation in the heat losses generated by each of the first drain 10 and the second drain 20 during exposure of a batch of substrates. This is because the substrate table WT is only positioned such that an edge of the substrate W is under the space 11 during certain times depending on the route required for exposure of the substrate W. For the first substrate W of a batch of substrates, the evaporation load is different than for the following substrates (because for the first substrate W there has not been a preceding substrate W moving under the projection system PS during which an variable evaporation load is set up). Furthermore, the timing delay of delivery of a substrate W from the track at the start of a new batch results in an evaporation load change due to drying up of the first drain 10 and/or the second drain 20 (and thereby less evaporation). The lack of consistency in timing, and in the route required for exposure, increases the difficulty of controlling the temperature of the substrate table WT to be uniform.

The construction details of the drain 10 will be described in detail below. However, it should be understood that the principles herein can be applied to any type of channel in an liquid supply system or fluid handling system which by virtue of use of the lithographic apparatus LA is provided with a varying flow of liquid and/or gas through it, and can thereby result in a thermal load, particularly where it results in varying amounts of evaporation and thereby varying thermal load.

In an embodiment at least one thermal conditioning channel 120 is provided in the substrate table WT for the passage therethrough of a thermal conditioning liquid to help maintain the temperature of the substrate table WT within a certain (e.g., predetermined) temperature range. However, this need not necessarily be the case. In an embodiment heaters are provided to help maintain the temperature of the substrate table WT with a certain (e.g., predetermined) temperature range. In an embodiment the heaters are electric heaters or Peltier heaters, for example. In an embodiment the thermal conditioning channel 120 and the heaters are provided. The predetermined temperature range may be within a few mK of a target temperature.

The first drain 10 is provided with an opening 42 and a channel 46. The channel 46 is in fluid communication with the opening 42 through a passageway 44. The second drain 20 is provided with an opening 22 and a channel 26. The channel 26 is in fluid communication with the opening 22 through a passageway 24. The opening 42 of the first drain 10 may be provided at one or more discrete locations around the periphery of the edge of the substrate W and may, in plan, be the slits or circular openings or any other shape. The opening 22 of the second drain 20 may be provided at one or more discrete locations around the periphery of the edge of the substrate W and may, in plan, be slits or circular openings or any other shape. The opening 42 of the first drain 10 and/or an opening 22 of the second drain 20, may only be a small opening, for example of 2 mm diameter, in the periphery of a substrate W.

An embodiment of the invention described below is applied to the first drain 10. However, an embodiment of the invention can equally be applied to the second drain 20 or to both the first drain 10 and the second drain 20.

As an example, more than 90% of the evaporation of liquid in the first drain 10 may take place in the channel 46 rather than in the passageway 44. However, the figure of 90% is an estimate. Depending on the arrangement and use of the lithographic apparatus LA, the figure may be closer to 50%, for example. It is possible that no evaporation of liquid in the first drain 10 takes place in the channel 46. The large thermal load in the channel 46 enters the surrounding material of the substrate table WT and leads to shrinking of the material taking place, which deforms part of the substrate table WT (and can result in deformation of the substrate W).

As described above, any temperature changes can cause deformation in the substrate W and/or substrate table WT. A temperature change may directly affect the substrate table WT and/or the substrate W. Even if the temperature only affects the substrate table WT, the substrate table WT carries the substrate W, therefore, deformation of the substrate table WT will (most likely) also deform the substrate W. In an embodiment, the position of interest is on the substrate W and the measured point is on the substrate table WT. Therefore, any deformation of the substrate table WT and/or the substrate W will alter the position of the point of interest relative to the measure point. Therefore, this alters the position of the point of interest relative to the measured point. Controlling the position of the substrate table WT by reference to the measured point alone will no longer accurately position the point of interest. Therefore, such deformations can cause an overlay error.

The present invention aims to provide an object positioning system which accurately positions the point of interest despite using a channel to remove liquid from a gap at the edge of an object and an object table, which causes deformation. The present invention does this by measuring, determining or estimating a characteristic of the two-phase flow within the channel and/or a characteristic of the object table carrying the object, and by basing control of the position of the object table on this characteristic.

In the present invention, the lithographic apparatus LA comprises a channel 46 for the passage therethrough of a two-phase flow. The channel 46 is formed within an object table. In the arrangement depicted in FIG. 4 and in the description below, the object table is a substrate table WT. It is not necessary for the object table to be a substrate table WT. The object table may be any component for carrying an object which comprises a channel for the passage of two-phase flow. For example, in an embodiment the object table may be a support structure MT, for example.

In the present invention, the object table (for example, the substrate table WT) carries an object. In the arrangement depicted in FIG. 4 and in the description below, the object is a substrate W. It is not necessary for the object to be a substrate W. The object may be any component carried by an object table. For example, in an embodiment, the object may be a patterning device MA, for example.

As described above, the channel causes a deformation of the object table and/or object, e.g. the substrate table WT and substrate W respectively.

In the description below, the invention will be primarily described with reference to a channel 46 that is positioned radially outward of the substrate W on the substrate table WT. However, it is not necessary for the channel 46 to be radially outward of the substrate W. For example, the invention is equally applicable to the channel 26 depicted in FIG. 4 as being positioned below the substrate W.

As depicted in FIG. 4, a sensor 50 is located in the substrate table WT radially outward of the channel 46. However, it is not necessary for the sensor 50 to be located radially outward of the channel 46. For example, the invention is easily applicable if the sensor 50 is located below the channel 46, above the channel 46 and/or radially inward of the channel 46. The sensor 50 is used in this embodiment to measure a characteristic of the substrate table WT. This measurement may then be used by a control system 62 to control the movement of the substrate table WT.

Figure 5:
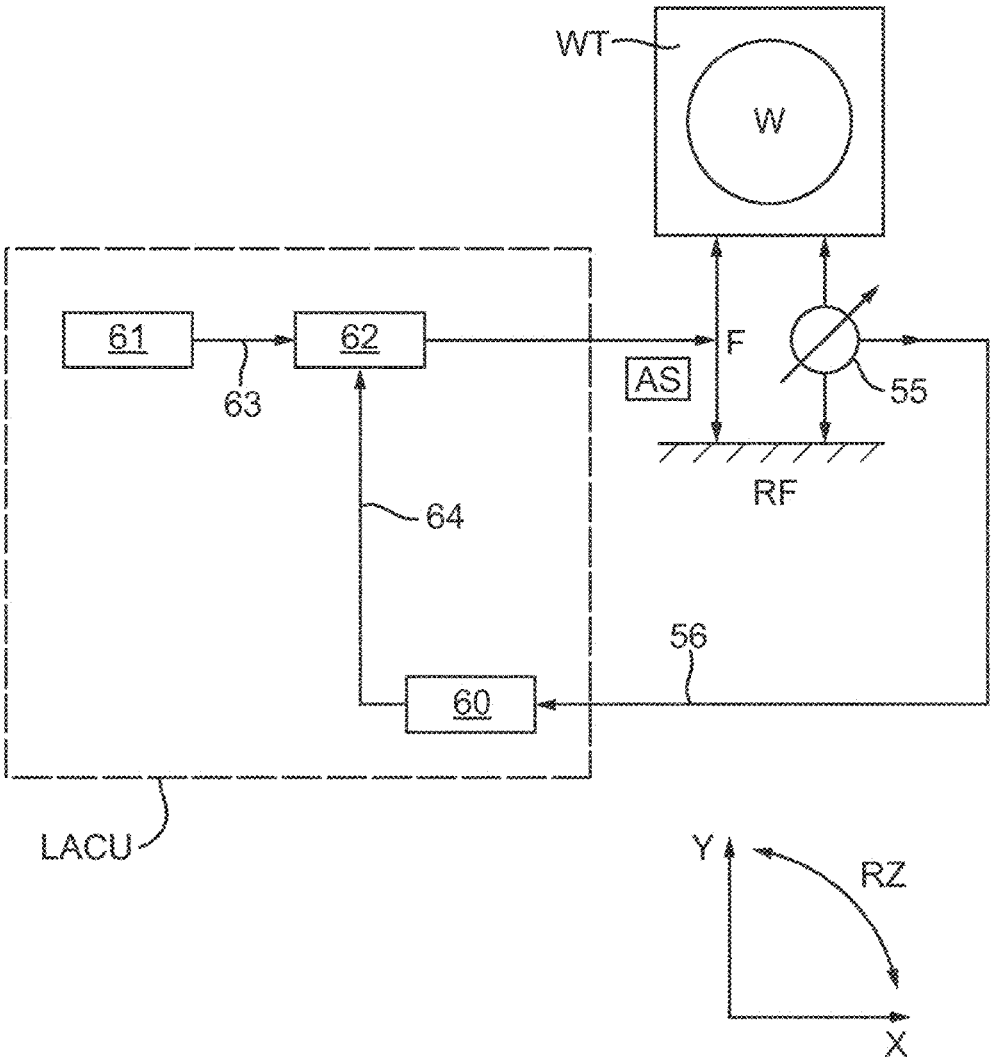
FIG. 5 depicts a schematic of an object positioning system according to an embodiment of the present invention.

A schematic depiction of an embodiment of the present invention is shown in FIG. 5. In this embodiment, the object (i.e. the substrate W) and the object table (i.e. the substrate table WT) are positioned relative to a reference RF e.g. the projection system PS. The substrate table WT has a channel 26, 46 for the passage therethrough of a two-phase flow. Furthermore, a control system 62 is provided to control the movement of the substrate table WT in at least one direction. The control system 62 may control the movement of the substrate table WT based on a quantity representative of the deformation of a part of the substrate W due to the two-phase flow through the channel 26, 46, as described below. The quantity representative of the deformation may be an estimation of deformation Additionally, a measurement system 55 may be provided to measure a characteristic to be used for determining the estimation of the deformation. The measurement system 55 may measure at least one characteristic of the substrate table WT and/or at least one characteristic of the two-phase flow through the channel 26, 46. The measurement system 55 may provide an output 56 based on the measured characteristic. The output 56 of the measurement system 55 may be transmitted to a predictor 60. The output 56 received from the measurement system 55 may be used by the predictor 60 to provide a signal 64 which is transmitted to the control system 62. The signal 64 may indicate an estimation of the deformation of a part of the substrate W due to the two-phase flow through the channel 26, 46 in the substrate table WT.

The measurement system 55 may comprise one or more sensors, e.g. position sensor IF of FIG. 1 and/or sensor 50 shown in FIG. 4. For example, the measurement system 55 may measure the position of the substrate table WT in one or more degrees of freedom, e.g. translations of direction X and/or Y and/or rotational direction Rz, relative to the reference RF.

Furthermore, an actuator system AS may have one or more actuators for positioning the substrate table WT preferably by applying a force F to the substrate tables WT. As seen in FIG. 5, the control system 62 may be configured to drive the actuator system AS. The control system 62 may be configured to control the actuator system AS to position the substrate table WT based on the signal 64 received from the predictor 60 and a set point signal 63 representing a desired position of the substrate tables WT.

The actuator system AS applies the force F (shown in FIG. 5) between the substrate table WT and the reference RF. The reference RF may be used by the measurement system 55 to determine the position of the substrate table WT relative to the reference RF. However, it is not necessary that the force F is applied to the reference RF. In order to minimize disturbances as a result of the applied forces a separate force frame (not shown) may be provided. The separate force frame may be any component in the lithographic apparatus LA which is used to apply force F to the substrate table WT. The separate force frame may be decoupled from the reference RF such that a force F may be applied to the substrate table WT without disturbing the reference RF.

The control system 62 may control the position of the substrate table WT in at least one direction using the actuator control system. For example, the at least one direction may be any of the translational directions X and/or Y and/or a rotational direction Rz. The at least one direction may correspond to a main moving direction during operational use of the substrate table WT. For example, an operation during operational use may include moving the substrate table WT during scanning, or stepping, or measuring, etc.

In FIG. 5 the measurement system 55 is shown as measuring the position of the substrate table WT relative to the reference RF. Although this figure may suggest that a direct measurement is performed, it is also possible that the measurement system 55 is configured to measure the position of the substrate table WT relative to another structure for example, the projection system PS, or one of the positioners PWa or PWb. Examples of degrees of freedom which can be measured by the measurement system 55 are an X-direction, a Y-direction perpendicular to the X-direction, and a rotational direction Rz about an axis perpendicular to both the X-and Y-direction, commonly referred to as the Z-axis. The measurement system 55 may be a position measurement system and may comprise any type of position sensor, for example, interferometric devices, encoder grid plates, accelerometers and capacitative sensors, etc. The position sensor may be configured to take measurements of the position of the object table, for example to measure the movement of the object.

In FIG. 5, the measurement system 55 may measure a characteristic of the substrate table WT or the two-phase flow within the channel 46 in the substrate table WT. The measurement system 55 may comprise the sensor 50 as shown in FIG. 4 to provide the output 56.

The output 56 from the measurement system 55 is a signal indicating the measurement made, which is sent to the predictor 60. The predictor 60 converts the output 56 to represent the estimated deformation of the substrate W in a specific direction at a measured location based on the measured characteristic(s). The estimated deformation is the estimated spatial change of the substrate W at that point. The estimated deformation may include the estimated deformation of the substrate W and/or the substrate table WT. In FIG. 5, the signal 64 representing the estimated deformation is provided to the control system 62 by the predictor 60. The estimated deformation may be determined by the predictor 60 using a dynamical model of the system. The model may be a finite element model. The model may include the geometry of the substrate W, the substrate table WT and any channels and/or drains formed within the substrate table WT. In an embodiment, the predictor 60 may use measurements taken by the measurement system 55 to adapt the dynamical mode, e.g. to produce a real time model. The predictor 60 may use a feedback loop in any of the above embodiments, optionally wherein a filter is used to speed up the response of the feedback loop. In an embodiment, the predictor 60 may use some sort of calibration process to determine the relationship between the estimated deformation and the measured characteristic(s), with or without the dynamic model.

The position of the point of interest in the X direction and the Y direction shown in FIG. 5 may affect the estimated deformation. The deformation due to evaporation in the channel tends to be larger at the edge of the substrate W if the channel is located at the edge of the substrate W, beneath the gap 5 between the substrate W and the substrate table WT. Conversely, the deformation due to the channel containing the two-phase flow may be small or even negligible at specific points, for example in the centre of the substrate W. Therefore, the estimated deformation may be calculated based on the position in the X direction and the Y direction of the point of interest, based on the variation of the deformation induced at different positions.

The estimated deformation is calculated by the predictor 60 based on the output 56 from the measurement system 55. In this embodiment, the predictor 60 estimates the deformation using a predetermined relationship between the measured characteristic and the estimated deformation that would be caused by the change in the characteristic. For example, the deformation within the substrate table WT may be directly proportional to the measured characteristic. Therefore, the estimated deformation and the measured characteristic may have a linear relationship with a predetermined constant at a specific point. The relationship between the measured characteristic and the estimated deformation may be more complex. A structural model may be used to estimate the deformation for example using structural equation modeling. The relationship between the measured characteristic and the estimated deformation may be derived empirically for example, by using a calibration process to determine the relationship between the estimated deformation and the measured characteristic. The relationship between the measured characteristic and the estimated deformation may be derived using interpolation. A model may be used by the predictor 60 based on any of these relationships.

Using the estimated deformation in the control system 62 means that the substrate table WT can be controlled to reduce or negate the effect of the two-phase flow in the channel 26, 46 within the substrate table WT. Therefore, the error induced by the two-phase flow in the channel 26, 46 can be reduced. In this way, the substrate W carried by the substrate table WT may be more accurately positioned than if the control system 62 does not use the estimated deformation when controlling the position of the substrate table WT. The estimated deformation may be used in different ways at different stages of the positional control. For example, the estimated deformation may be used to determine the set point, or may be applied as a position offset to the set point, or may be applied as a force offset for the actuators to apply to the substrate table WT.

The set point signal 63 may be provided to the control system 62 by a set point generator 61. The set point may be updated based on the location point of interest and measurements received from the measurement system 55 and/or the signal 64 from the predictor 60 and/or an output from the control system 62. The set point generator 61, the predictor 60 and/or the control system 62 may be part of a lithographic apparatus control unit LACU as also depicted in FIG. 1.

As shown in FIG. 5, the inputs to the control system 62 are from the predictor 60 (which as described above is the signal 64 representing the estimated deformation of the substrate W) and the set point signal 63 from the set point generator 61 (which is representative of the desired position of the substrate W). From the inputs, the control system 62 determines the force F required to position the substrate table WT in the desired position. As such, the control system 62 may control the movement of the substrate table WT in at least one direction based on the estimated deformation of the substrate W and the set point representing the desired position of a point of interest on the substrate W. In this way, the deformation, due to the thermal load, may be decreased.

As mentioned, the output 56 from the measurement system 55 is representative of the measured point on the substrate table WT. The control system 62 and/or the predictor 60 can use the position of the measured point to determine the position of the point of interest using the known relationship the between point of interest and the measured point. Although the relationship between these points is known (or at least assumed), any deformation in the substrate W and/or the substrate table WT would cause an error in the position of the point of interest relative to the measured point. The estimated deformation may be used to reduce, or remove, the error in the known relationship between the measured point and the point of interest. The control system 62 uses these inputs to position the point of interest at the desired position.

Figure 6:
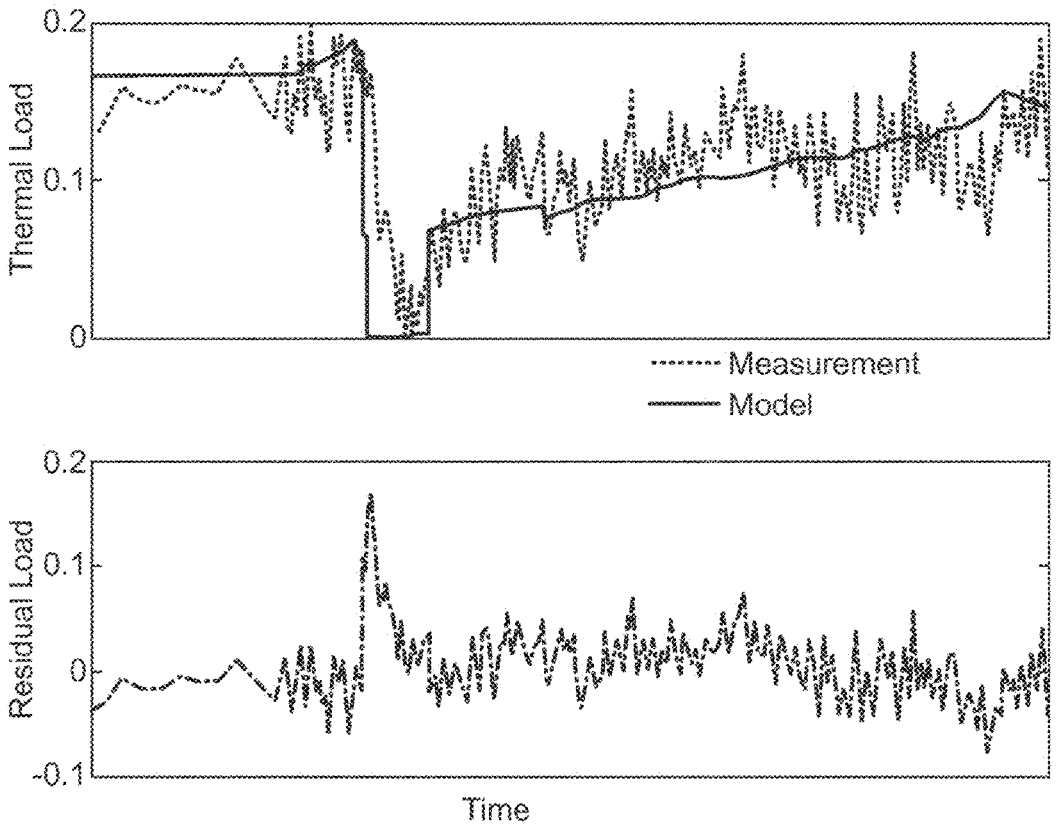
FIG. 6 is a graph showing the measured load, modeled load and residual load in a section of a substrate table

In FIG. 6, an example is shown of a thermal load acting on a part of a substrate table WT. The thermal load may be measured using the measurement system 55 of any of the above embodiments, optionally comprising multiple sensors. Using a model for the time and location dependent thermal load caused by a two-phase flow, the deformation of the substrate table WT and the substrate W is calculated. The scaling of the modeled thermal load may use at least one measurement of the two-phase flow. The accuracy of an example of such a model is illustrated in the plot of the residual load in FIG. 6. As can be seen, the residual load is the measured load minus the modeled load. Therefore, if the control system 62 uses a model to account for the thermal load based on at least one measured characteristic, this may reduce the effect of the thermal load, such that the effect of the load acting on the object is nearer to the effect of the residual load, rather than the measured load, as seen in FIG. 6.

In an embodiment, the signal 64 from the predictor 60 may be sent directly to the actuator system AS. In this embodiment, the predictor 60 may not send the signal 64 to the control system 62. In this embodiment, the control system 62 may determine the force F to be applied to the substrate table WT based on the set point. In an embodiment, the predictor 60 may determine an estimated offset force based on the output 56 from the measurement system 55. In this embodiment, the control system 62 may control the actuator system AS to position the substrate table WT as accurately as possible, and the predictor 60 indicates an offset to the force F to be applied to account for any error between the measured point and the point of interest due to the temperature variation caused by the two-phase flow in the channel 26, 46.

The measurement system 55 may comprise a single sensor. The measurement system 55 may comprise multiple sensors. In this case, the sensors may be the same or different, and may measure any combination of characteristics of the two-phase flow and/or the substrate table WT. Sensors may be located at any point on or in the substrate table WT. Sensors may be located within the channel 26, 46 and/or in the substrate table WT adjacent to the channel 26, 46. Sensors may be located within the substrate table WT around the circumference of the substrate W in plan view. Sensor located nearer to the channel 26, 46 may provide measurements which more quickly respond to a change due to the thermal load than sensors located further away. For example, at least one sensor may be a temperature sensor, a strain and/or a temperature and strain sensor.

In an embodiment, the measurement system 55 may comprise a temperature sensor and the measured characteristic is the temperature of the object table at a location on or in the object table and/or the temperature of the two-phase flow. For example, the sensor may be a negative temperature coefficient thermistor (an NTC sensor), or an infrared temperature sensor.

In an embodiment, the measurement system 55 may comprise a strain sensor and the measured characteristic is the strain of the object table at a location on or in the object table. Any type of strain sensor may be used to measure the strain, for example, a piezoelectric strain sensor or an optical fibre based sensor. Preferably, the strain sensor used is configured to measure the strain in the order of n$\epsilon$ or p$\epsilon$, i.e. due to variations in the order of nm or pm.

In an embodiment, the measurement system 55 may comprise a temperature and strain sensor and the measured characteristics are both the temperature and the strain of the object table at a location on or in the object table. For example, the temperature and strain sensor may be a Fiber Bragg grating. Fiber Bragg gratings may reduce the number of optical fibers required, may provide fast measuring response and may reduce electro-magnetic disturbance compared to other sensors.

In an embodiment, the measurement system 55 may comprise a sensor configured to detect the position of a target point on or in the substrate table WT.

In an embodiment, the measurement system 55 may comprise a sensor configured to measure a characteristic of the two-phase flow. For example, the sensor may measure mass flow rate of the gas or liquid phase of the two-phase flow, humidity (e.g. relative humidity) of the two-phase flow (i.e. either the humidity of the full two-phase flow, or the humidity of incoming gas), temperature of the two-phase flow, pressure of the two-phase flow, density of the two-phase flow and/or an optical characteristic of the two-phase flow, for example using a birefringence sensor, or an interferometer, etc. The two-phase flow comprises a liquid flow and a gas flow. It may be preferable to measure a certain characteristic of a certain part of the two-phase flow, for example, the mass flow rate of the gas flow, or the humidity of the gas flow at a certain point, e.g. the humidity of incoming gas flow. For example, a negative temperature coefficient thermistor may be used to measure the temperature of the two-phase flow.

In an embodiment, the measurement system 55 may comprise a sensor configured to measure a characteristic of the lithographic apparatus LA. For example, a sensor may be configured to measure a characteristic of another component within the lithographic apparatus LA. For example, in this embodiment, the measurement system 55 may be configured to measure the power supplied to heaters provided to help maintain the temperature of the substrate table WT. The heaters may be located in the substrate table WT. The power supplied being the measured characteristic. A known relationship may be used to determine the deformation based on the power supplied.

In an embodiment, the measurement system 55 may comprise a sensor configured to measure a characteristic of the surrounding environment. For example, a sensor may be configured to measure the temperature and/or relative humidity of the air surrounding the lithographic apparatus LA.

In any of the above embodiments, at least one sensor 50 and/or the measurement system 55 may be located outside of the substrate table WT. For example, the sensor 50 and/or the measurement system 55 may be on or in the second positioning device PW. In this embodiment, the sensor 50 may still be used to measure a characteristic of the substrate table WT. In an example of this embodiment, the sensor 50 may be an infrared temperature sensor taking measurements of the temperature of the substrate table WT. In an example of this embodiment, the sensor 50 may be a position sensor. In this example, the substrate table WT may comprise a grid, on the surface of the substrate table WT or as an additional component on the substrate table WT, and the position sensor may be used to detect the position of the grid.

In any of the above embodiments, pre-existing sensors in the lithographic apparatus LA may be used as the sensor 50 in the present invention.

In any of the above embodiments, the measured characteristic may be used to determine the estimated deformation as described above. The measured characteristic may be the quantity representative of the deformation. In any of the embodiments the measured characteristics may also be used by other parts of the lithographic apparatus LA, for example for diagnostics of the system, or to control the temperature of the heaters.

In an embodiment, the measurement system 55 may be within the substrate table WT and may transmit the output 56 wirelessly to the control system 62 external to the control system, 62, although this is not necessarily the case.

The predictor 60 may or may not be a part of the lithographic apparatus control unit LACU, i.e. the predictor 60 may be a separate control unit. The predictor 60 may be separate from the control system 62 within the LACU, as depicted in FIG. 5. Alternatively, the predictor 60 may be part of the control system 62, such that the control system 62 receives the output 56 from the measurement system 55 and uses the output 56 directly to estimate the deformation and control the position of the substrate table WT.

In the above embodiments, the object table may be the substrate table WT. However, the object table may alternatively or additionally be a support structure MT, first positioning device PM, second positioning device PW, or any other object which may need to be positioned in lithographic apparatus LA and which carries an object, where applicable.

The placement of the projection beam B on the object is movable in at least one direction relative to the object. The placement of the pattern (in the projection beam B) on the object is movable in at least one direction relative to the object. In the above embodiments, the object table, e.g. the substrate table WT, is controlled to alter the position of the point of interest. Additionally or alternatively to the above embodiments, the position of the pattern and/or the projection beam B relative to the object may be controlled. For example, the position of the support structure MT, the patterning device MA, a plate manipulator and/or a component within the projection system PS, e.g. an optical component, may be controlled to vary the positioning of the projection beam B relative to the object. As such, the placement of the projection beam relative to the object is controllable, for example, using a plate manipulator. Therefore, the position of the pattern and/or projection beam B relative to the object may be controlled based on the estimated deformation. As such the relative position of the pattern to the object may be controlled in order to reduce (or eliminate) the effect of the deformation of the object and/or the object table caused by the two-phase flow in the channel 26, 46 within the object table.

The plate manipulator is located between the patterning device MA and the substrate W to control the focus of the radiation beam. The plate manipulator may be adapted to tilt about certain axes such that the image projected onto the substrate W is shifted.

It is possible that the positioning accuracy in X-direction is not as demanding as it is for the Y-direction, or that the required positioning accuracy is only applicable when the substrate table WT is accelerated in Y-direction only, so that the behaviour in X-direction is less relevant. Therefore, it may be useful to control the substrate table WT based on the output 56 of the measurement system 55 only in one direction. The above embodiments use the X, Y and Rz, directions as examples of directions in which the substrate table WT may be moved or positioned. However, the substrate table WT may be moved or positioned in any axis direction including the X, Y and/or Z directions and the rotational directions relative to those directions, or along a direction based on any other axis which may be rotated or translated relative to the X-Y axis depicted in the Figures.

There are a variety of varying loads which may act on the object and/or object table and the present invention may be used to control the movement of the object table, or of the projection beam B relative to the object to reduce (or negate) the deformation caused by any combination of loads. As such, in any of the above embodiments, a channel for the passage therethrough of a two-phase flow may not be included in the object table. However the varying loads during operational use may still cause deformation of the object table and/or object that affects the object. Therefore, the control system 62 may be used to reduce the effects of the varying loads as described above in combination with any embodiment, with or without the presence of a channel for the passage therethrough of a two-phase flow. Reference to a substrate table WT or an object table may be synonymous with other components within the lithographic apparatus which are controlled as in the present invention. The varying load my be any thermal load, for example, load due to phase transition, friction, radiation, convection, conduction, electronic dissipation or any other thermal effect.

Figure 7:
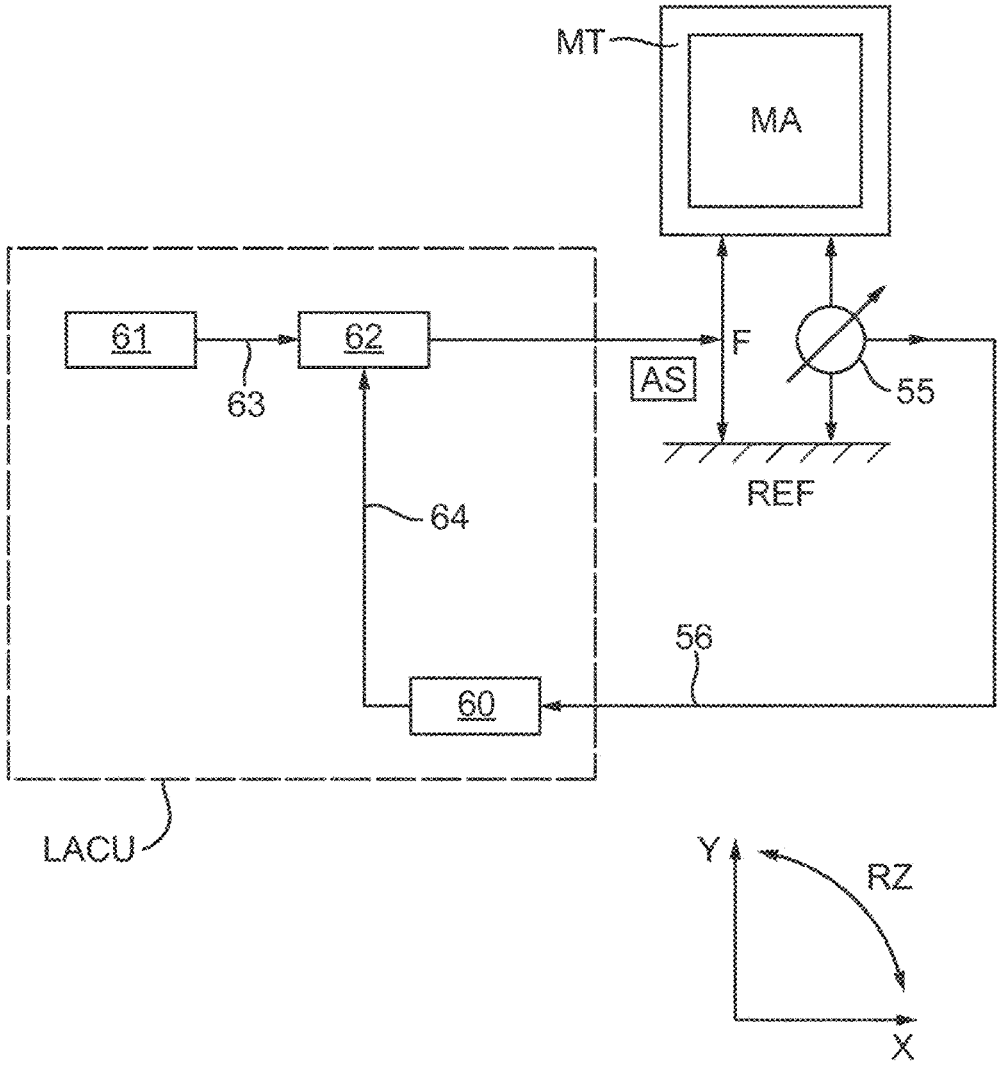
FIG. 7 depicts a schematic of an object positioning system according to a further embodiment of the present invention.

A further embodiment is depicted in FIG. 7. This embodiment may be the same as any of the above embodiments described in relation to FIG. 5, except as herein described. In this embodiment, the substrate table WT may be replaced with a support structure MT, i.e. the object table is the support structure MT, and the substrate W may be replaced with a patterning device MA, i.e. the object is the patterning device MA. Although the support structure MT may not have a channel for the passage therethrough of a two-phase flow, deformation of the support structure MT may still occur, for example due to thermal variations or a varying load, which results in deformation of the patterning device MA. Any deformation of the support structure MT and/or the patterning device MA may alter the position of the point of interest on the patterning device MA relative to the projection beam B and thus, the position of the pattern in the projection beam B will be altered relative to the substrate W. This error in positioning the pattern in the projection beam B can cause overlay error. Furthermore, deformation of the patterning device MA (which may be due to deformation of the support structure MT) may deform the image in the projection beam B, causing imaging errors.

As such, it is beneficial to position the patterning device MA accurately to ensure that the projection beam B is correctly patterned. The patterning device MA may have a point of interest, e.g. the centre of an area of the patterning device MA which is illuminated to impart the pattern onto the projection beam B at any given moment. It may not be possible to measure the location of the point of interest on the patterning device MA directly (similarly to a point of interest on the substrate W). Therefore, the patterning device MA may be positioned by controlling a measured point, wherein the position of the point of interest relative to the measured point is known. In an embodiment, the point of interest is on the patterning device MA and the measured point is on the support structure MT. In this embodiment, the support structure MT may be moved relative to a further reference frame REF as depicted in FIG. 7. The reference frame RF and the further reference frame REF may be in some way connected.

Deformation of the patterning device MA and/or the support structure MT alters the position of the point of interest relative to the measured point. Temperature variation and/or any other load imposed can cause deformation of the patterning device MA and/or the support structure MT leading to changes in the position of the point of interest relative to the measured point. Therefore, as described in the above embodiments, the present embodiment provides an object positioning system which accurately positions the point of interest despite temperature or load variations in the patterning device MA and/or support structure MT. The present embodiment does this in the same way as in the above embodiments in that a characteristic of the support table MT is measured, determined and or estimated, and control of the position of the support table MT is based on this measurement.

A measurement system 55 may be used as described above. The measurement system 55 may be used with an actuator system AS, predictor 60 and/or control system 62 as described above, except that the substrate table WT is replaced with the support structure MT and the substrate W is replaced with the patterning device MA. The measurement system 55 may comprise at least one of any of the above mentioned sensors, e.g. a temperature sensor (e.g. a negative temperature coefficient thermistor (an NTC sensor) or an infrared temperature sensor), a strain sensor (e.g. a piezoelectric strain sensor or an optical fibre based sensor), a temperature and strain sensor (e.g. a Fibre Bragg grating), a sensor configured to measure the position of a target point on or in the support structure MT, a sensor configured to measure a characteristic of the lithographic apparatus LA, and/or a sensor configured to measure the surrounding environment.

Figure 8:
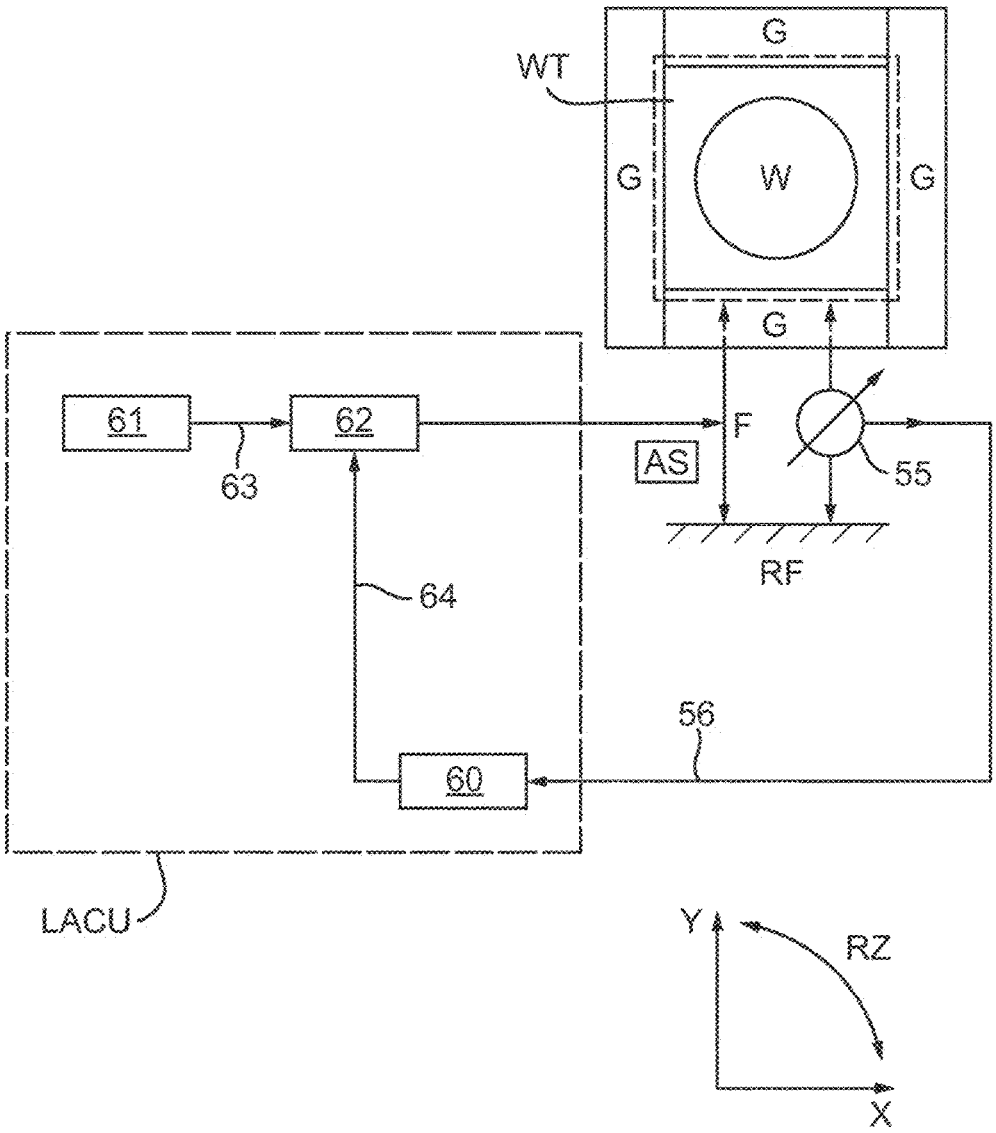
FIG. 8 depicts a schematic of an object positioning system according to a further embodiment of the present invention.

A further embodiment is depicted in FIG. 8. This embodiment may be the same as any of the above embodiments described in relation to FIG. 5, except as herein described. This embodiment includes a measurement system 55 which comprises a displacement measurement system. In this embodiment, the object is a component of the displacement measurement system and the object table is the substrate table WT, i.e. the substrate table WT carries a component of the displacement measurement system. For example, the displacement measurement system may comprise a displacement sensor DS and a target.

Figure 9:
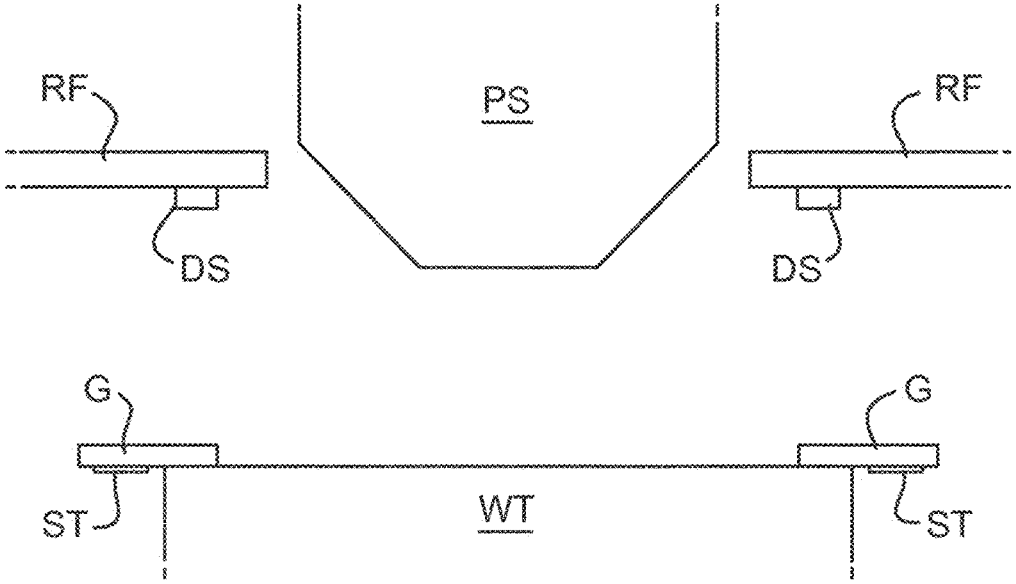
FIG. 9 depicts in side view a part of a substrate table and projection system of FIG. 8 according to the further embodiment of the present invention.

The target may be a grid plate G. As depicted in FIG. 8, several grid plates G may be used. The output of the displacement measurement system may be used to determine the location of the target. As depicted in FIG. 9, a component of the displacement measurement system, e.g. at least one displacement sensor DS, may be located on a reference frame RF, the reference frame RF may be the same as the reference frame described in any of the above embodiments.

In this embodiment, the displacement sensor DS is used to detect the displacement of the target, and thus, the displacement of the substrate table WT. The target may have a point of interest, i.e. the point on the target at which the displacement measurement system takes the measurement. Deformation of the substrate table WT and/or a grid plate G may alter the position of the point of interest relative to the measured point. Temperature variation and/or any other load imposed can cause deformation of the substrate table WT and/or the grid plate G leading to changes in the position of the point of interest which may result in an error in the measurement. Therefore, as described in the above embodiments, the present embodiment provides an object positioning system which accurately positions the point of interest despite variations in the substrate table WT and/or a component of the position measurement system. The present embodiment does this in the same way as in the above embodiments in that a characteristic of the substrate table WT and/or of the grid plate G is measured, determined and/or estimated, and control of the position of the substrate table WT is based on this measurement.

The measurement system 55 may be used, as described in the above embodiments in that a characteristic of the grid plate G and/or the substrate table WT is measured, determined and or estimated, and control of the position of the substrate table WT is based on this measurement. The measurement system 55 may be used with an actuator system AS, predictor 60 and/or control system 62 as described above, except that the substrate W is replaced with a grid plate G. The measurement system may further comprise at least one of any of the above mentioned sensors, e.g. a temperature sensor (e.g. a negative temperature coefficient thermistor (an NTC sensor) or an infrared temperature sensor), a strain sensor (e.g. a piezoelectric strain sensor or an optical fibre based sensor), a temperature and strain sensor (e.g. a Fibre Bragg grating), a sensor configured to measure the position of a target point on or in the substrate table WT, a sensor configured to measure a characteristic of the lithographic apparatus LA, and/or a sensor configured to measure the surrounding environment. As depicted in FIG. 8, the target may be a grid plate G on the substrate table WT. Although FIG. 8 depicts 4 grid plates G, there may be any suitable number, e.g. 1, 2, 3, 4, 5, 6, 7, 8, or more. The grid plates G are depicted as surrounding the substrate table WT, although at least one grid plate G may be provided on top of the substrate table WT within the edge of the substrate table WT. FIG. 8 depicts two pairs of grid plates G wherein each pair has two similarly shaped grid plates G. The grid plates G may or may not be provided in pairs. The shape of the grid plates G is not limiting. If multiple grid plates G are provided, each grid plate G may have a different shape, some grid plates G may have the same shape, or all the grid plates G may have the same shape. The grid plates G may be replaced with any suitable target.

FIG. 9 depicts a side view of FIG. 8, in which the measurement system 55 comprises a strain sensor ST to measure the strain of the grid plate G. The strain sensor ST of FIG. 9 is exemplary and may be replaced with any appropriate sensor as part of the measurement system 55. As depicted in FIG. 9, the grid plates G (i.e. the target) may be located on the substrate table WT. Alternatively, another component of the displacement measurement system, e.g. the displacement sensor DS may be located on the substrate table WT. As such, in an embodiment, the object may be the displacement sensor DS, which is carried by the substrate table WT. The measurement system 55 can be used to measure a characteristic of the component located on the substrate table WT to account for any deformation in the measurement to improve the accuracy of the measurement provided by the displacement measurement system as described in relation to FIG. 5, wherein the substrate W is replaced with a component of the displacement measurement system mas described.

Figure 10:
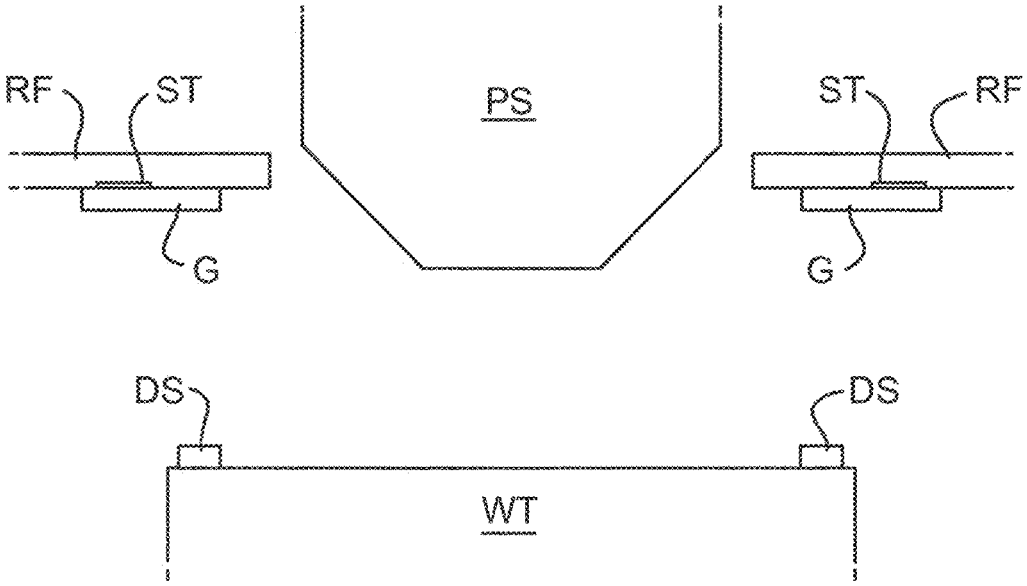
FIG. 10 depicts in side view a part of a substrate table and projection system according to a further embodiment of the present invention.

FIG. 10 depicts a further embodiment which is the same as the embodiment of FIG. 9 except as herein described. In the embodiment depicted in FIG. 10, the object table carries at least a part of the displacement measurement system as in FIG. 9, however, the deformation of a part of the displacement measurement system not located on the object table may be measured. As in FIG. 9, any error in the measurement taken by the displacement measurement system may lead to an error in the positioning of the object table, e.g. the substrate table WT.

In this embodiment, the substrate table WT carries at least part of the displacement measurement system, the substrate table WT being movable in at least one direction. The displacement measurement system comprises the displacement sensor DS and a grid plate G, wherein a varying load acts on the displacement sensor DS and/or the grid plate G, during operational use, causing deformation of a part of the displacement sensor DS and/or the grid plate G, respectively. The embodiment further comprises a control system to control the movement of the substrate table WT in the at least one direction based on an output from the displacement measurement system and a quantity representative of the deformation of the part of the displacement sensor DS and/or the grid plate G, respectively.

A part of the displacement measurement system may be located on the reference frame RF. For example, as depicted in FIG. 10, the target, for example at least one grid plate G, may be located on the reference frame RF. Variations, for example in temperature or load acting on the grid plates G during operational use causes deformation of the grid plates G which will lead to an error in the displacement measurement. Therefore, controlling the movement of the substrate table WT based on an output of the displacement measurement system and a quantity representative of the deformation of the grid plates G reduces the effect of an error induced by deformation of a component of the displacement measurement system.

Although FIG. 10 depicts two grid plates G in the side view, any number of grid plates may be provided on the reference frame RF, e.g. 1, 2, 3, 4, 5, 6, 7, 8, or more. Furthermore, the grid plate G may be replaced with any component of the displacement measurement system, for example, the displacement sensor DS may be placed on the reference frame RF instead of the grid plates G.

In accordance with the above embodiments, the point of interest may change. For example, when the object table is a substrate table WT supporting the object, the object being a substrate W, then the substrate table WT may be moved to expose different target portions C of the substrate W. In this case, the point of interest on the substrate W changes for each exposure. Alternatively, when the object table is a support structure MT supporting a patterning device MA, then the point of interest may change during exposure, i.e. as the patterning device MA is illuminated to impart the projection beam B with a pattern. After the estimated deformation has been determined for a particular point of interest, it may be possible to use the estimated deformation for other points of interest. For example, it may be assumed that the magnitude of the estimated deformation is constant at a given radius (even if the direction of the estimated deformation varies). Therefore, the estimated deformation from one point of interest may be used for other points of interest, for example, other points at the same radius.

In the above embodiments, the estimated deformation is used in the control system 62 to control the movement of the substrate table WT whilst using the output 56 of the measurement system 55 to account for deformation, for example, due to the effect of the two-phase flow. However, the estimated deformation may not be used by the control system 62 in this way. As an alternative, the estimated deformation may be used to determine an estimated offset at a point, which may be applied as a measurement system correction on a position measured by a position sensor. As such, a measurement, which has been adapted to account for the cause of the deformation, e.g. the two-phase flow, may be used by the control system 62 directly for comparison with the desired position of a point of interest. In this way, the control system 62 controls the position of the substrate table WT based on an input relating to the set point signal 63 and the output 56 from the measurement system 55. In this embodiment, the predictor 60 may not be required.

In the present embodiment, a model may be used to predict the variation of the deformation of the object, e.g. the substrate W, the patterning device MA, or a component of the displacement measurement system. A deformation predictor system may be used to generate a signal indicative of the predicted deformation. The deformation predictor system may or may not be part of the lithographic apparatus control unit LACU. The predicted deformation may be used in the same way as the estimated deformation as in the above embodiments in the control system 62 to control the movement of the object table, e.g. the substrate table WT. Using a model in this way allows a reduction in the adverse effects two-phase flow in a channel in the substrate table WT, as described in the above embodiments.

While specific embodiments of the invention have been described above, it will be appreciated that the invention may be practiced otherwise than as described. For example, the control system 62 and/or the predictor 60 of the invention may take the form of a computer program containing one or more sequences of machine-readable instructions describing a method as disclosed above, or a data storage medium (e.g. semiconductor memory, magnetic or optical disk) having such a computer program stored therein.

An object positioning system and/or a device manufacturing method may be provided in accordance with any of the above embodiments. The manufacturing method may use a lithographic apparatus according to any one of the embodiments of the present invention.

In any of the embodiments, an object may be used in place of an object and an object table. In such an embodiment, the object may be movable in at least one direction. A channel for the passage therethrough of two-phase flow may be formed within the object, wherein the two-phase flow through the channel causes a deformation of a part of the object. In this embodiment, a control system controls the movement of the object based on an estimation of the deformation of the part of the object due to the two-phase flow through the object. In this embodiment, the object may be any of the components within a lithographic apparatus LA which may need to be positioned. For example, the object may be an optical element for example in the projection system PS, or the first positioning device PM, or the second positioning device PW, or the liquid confinement structure IH, etc.

Although specific reference may be made in this text to the use of lithographic apparatus LA in the manufacture of ICs, it should be understood that the lithographic apparatus LA described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of or about 365, 248, 193, 157 or 126 nm), infrared radiation, and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. The descriptions above are intended to be illustrative, not limiting. Thus, it will be apparent to one skilled in the art that modifications may be made to the invention as described without departing from the scope of the claims set out below.

The invention claimed is:

[1. A lithographic apparatus comprising:

a liquid supply system configured to supply a liquid to a space between a projection system and a substrate;

an object table configured to carry an object, the object table being movable in at least one direction, the object table comprising a channel for the passage therethrough of a two-phase flow comprising liquid from the space, wherein the two-phase flow through the channel causes a varying load to act on the object table causing deformation of a part of the object; and a control system to control the movement of the object table in the at least one direction based on a quantity representative of the deformation of the part of the object.]

[2. A lithographic apparatus comprising:

a liquid supply system configured to supply a liquid to a space between a projection system and a substrate;

an object table configured to carry an object, the object table comprising a channel for the passage therethrough of a two-phase flow comprising liquid from the space, wherein the two-phase flow through the channel causes a varying load to act on the object table causing deformation of a part of the object;

a projection system configured to project a pattern on a patterning device onto the object using a projection beam, wherein placement of the projection beam on the object is movable in at least one direction relative to the object; and a control system to control the placement of the pattern relative to the object in the at least one direction based on a quantity representative of the deformation of the part of the object.]

[3. The lithographic apparatus according to claim 1, further comprising a measurement system comprising at least one sensor to measure at least one characteristic of the two-phase flow, wherein at least one measured characteristic is used for determining the quantity representative of the deformation.]

[4. The lithographic apparatus according to claim 1, further comprising a measurement system comprising at least one sensor to measure at least one characteristic of the object table, at least one characteristic of the object, at least one characteristic of another component within the lithographic apparatus, and/or at least one characteristic of an environment surrounding the lithographic apparatus, wherein at least one measured characteristic is used for determining the quantity representative of the deformation.]

[5. The lithographic apparatus according to claim 1, further comprising a predictor, the predictor being configured to determine the quantity representative of deformation based on a model of the object table and/or the object, wherein the predictor uses at least one measured characteristic from at least one sensor.]

[6. The lithographic apparatus according to claim 1, further comprising an actuator system with one or more actuators and a position measurement system, the position measurement system comprising a position sensor, wherein the control system is configured to control the actuator system to move the object table and the position sensor is configured to take measurements of the position of the object table to measure the movement of the object.]

[7. The lithographic apparatus according to claim 1, comprising the projection system, a substrate table and a support structure, wherein the projection system is configured to project a pattern on a patterning device onto the substrate, wherein the support structure is configured to hold the patterning device, wherein the substrate table is configured to hold the substrate, and wherein the object comprises the substrate and the object table comprises the substrate table or wherein the object comprises the patterning device and the object table comprises the support structure.]

[8. A lithographic apparatus comprising:

a displacement measurement system comprising a target configured to receive a radiation beam and an optical displacement sensor configured to detect at least part of the radiation beam redirected by the target, wherein a varying load acts on the displacement sensor and/or the target, during operational use, causing deformation of a part of the displacement sensor and/or the target respectively;

an object table which carries at least part of the displacement measurement system, the object table being movable in at least one direction; and a control system to control the movement of the object table in the at least one direction based on an output from the displacement measurement system and a quantity representative of the deformation of the part of the displacement sensor and/or the target respectively.]

[9. The lithographic apparatus according to claim 8, wherein the displacement measurement system is part of a measurement system, the measurement system comprising at least one sensor to measure at least one characteristic of the displacement sensor and/or the target, at least one characteristic of another component within the lithographic apparatus, and/or at least one characteristic of an environment surrounding the lithographic apparatus, wherein at least one measured characteristic is used for determining the quantity representative of the deformation.]

[10. The lithographic apparatus according to claim 8, further comprising a predictor, the predictor being configured to determine the quantity representative of deformation based on a model of the displacement sensor and/or the target respectively, wherein the predictor uses at least one measured characteristic from at least one sensor.]

[11. The lithographic apparatus according to claim 8, further comprising an actuator system with one or more actuators wherein the control system is configured to control the actuator system to move the object table and the displacement sensor is configured to take measurements of the displacement of the object table to measure the movement of the object table.]

[12. The lithographic apparatus of claim 8, wherein the object table comprise a channel for the passage therethrough of a two-phase flow, wherein the two-phase flow through the channel causes a varying load to act on the object table.]

[13. The lithographic apparatus of claim 8, wherein the measured characteristic is at least one selected from: the temperature of the displacement sensor and/or the target, the strain of the displacement sensor and/or the target, both the temperature and the strain of the displacement sensor and/or the target, temperature of the environment surrounding the lithographic apparatus, and/or humidity of the environment surrounding the lithographic apparatus.]

[14. The lithographic apparatus according to claim 8, comprising a projection system, a substrate table and a support structure, wherein the projection system is configured to project a pattern on a patterning device onto a substrate, wherein the support structure is configured to hold the patterning device, wherein the substrate table is configured to hold the substrate, and wherein the object table comprises the substrate table or wherein the object table comprises the support structure.]

[15. The lithographic apparatus according to claim 2, further comprising a measurement system comprising at least one sensor to measure at least one characteristic of the two-phase flow, wherein at least one measured characteristic is used for determining the quantity representative of the deformation.]

[16. The lithographic apparatus according to claim 15, wherein the measured characteristic is at least one of selected from: temperature of the two-phase flow, mass flow rate of the two-phase flow, and/or humidity of the two-phase flow.]

[17. The lithographic apparatus according to claim 2, further comprising a measurement system comprising at least one sensor to measure at least one characteristic of the object table, at least one characteristic of the object, at least one characteristic of another component within the lithographic apparatus, and/or at least one characteristic of an environment surrounding the lithographic apparatus, wherein at least one measured characteristic is used for determining the quantity representative of the deformation.]

[18. The lithographic apparatus according to claim 2, further comprising a predictor, the predictor being configured to determine the quantity representative of deformation based on a model of the object table and/or the object, wherein the predictor uses at least one measured characteristic from at least one sensor.]

[19. The lithographic apparatus according to claim 2, further comprising an actuator system with one or more actuators and a position measurement system, the position measurement system comprising a position sensor, wherein the control system is configured to control the actuator system to move the object table and the position sensor is configured to take measurements of the position of the object table to measure the movement of the object.]

[20. The lithographic apparatus according to claim 3, wherein the measured characteristic is at least one selected from: the temperature of the object table at a location on or in the object table, the strain of the object table at a location on or in the object table, both the temperature and the strain of the object table at a location on or in the object table, temperature of the environment surrounding the lithographic apparatus, and/or humidity of the environment surrounding the lithographic apparatus.]

*21. An object positioning system for a lithographic apparatus, the lithographic apparatus comprising a liquid supply system configured to supply a liquid to a space between a projection system and a substrate, wherein the object positioning system comprises:*

*an object table configured to carry an object, the object table being movable in at least one direction, the object table comprising a channel for the passage therethrough of a two-phase flow comprising liquid from the space, wherein the two-phase flow through the channel causes a varying load to act on the object table causing deformation of a part of the object table and/or object:*

*one or more sensors configured to measure a characteristic;*

*one or more heaters configured to maintain a temperature of the object table;*

*a predictor configured to determine a quantity representative of the deformation of the part, the quantity determined based on the measured characteristic and on a model or relationship representing at least the varying load; and*

*a control system to control a heater of the one or more heaters based on an output from the one or more sensors.*

*22. The object positioning system according to claim 21, wherein a sensor of the one or more sensors is configured to measure a characteristic of the two-phase flow, wherein the measured characteristic of the two-phase flow is used for determining the quantity representative of the deformation of the part.*

*23. The object positioning system according to claim 22, wherein the measured characteristic is at least one selected from: temperature of the two-phase flow, mass flow rate of the two-phase flow, and/or humidity of the two-phase flow.*

*24. The object positioning system according to claim 21, further comprising an actuator system with one or more actuators and a position measurement system, the position measurement system comprising a position sensor, wherein the control system is configured to control the actuator system to move the object table and the position sensor is configured to take measurements of the position of the object table to measure the movement of the object.*

*25. The object positioning system according to claim 21, wherein the one or more sensors comprises at least one sensor to measure at least one characteristic of the object table, at least one characteristic of the object, at least one characteristic of another component within the lithographic apparatus, and/or at least one characteristic of an environment surrounding the object table, wherein the at least one measured characteristic is used for determining the quantity representative of the deformation.*

*26. The object positioning system according to claim 25, wherein the at least one measured characteristic is at least one selected from: temperature of the object table at a location on or in the object table, strain of the object table at a location on or in the object table, both temperature and strain of the object table at a location on or in the object table, temperature of the environment surrounding the object table, and/or humidity of the environment surrounding the object table.*

*27. The object positioning system according to claim 21, wherein the control system is configured to control a characteristic of the lithographic apparatus based on the quantity representative of the deformation of the part.*

*28. The object positioning system according to claim 27, wherein the control system is configured to control a characteristic of the object table based on the quantity representative of the deformation of the part.*

*29. The object positioning system according to claim 27, wherein the control system is configured to control a heater of the one or more heaters based on the quantity representative of the deformation of the part.*

*30. A lithographic apparatus comprising:*

*the object positioning system according to claim 21; and*

*a liquid supply system configured to supply a liquid to a space between a projection system and the object table.*

*31. An object positioning system for a lithographic apparatus, the object positioning system comprising:*

*a measurement system comprising a target configured to receive a radiation beam and an optical sensor configured to detect at least some of the radiation beam redirected by the target, wherein a varying load acts on the optical sensor and/or the target, during operational use in the lithographic apparatus, causing deformation of a part of the optical sensor and/or the target respectively;*

*an object table which carries at least a portion of the measurement system, the object table being movable in at least one direction;*

*one or more sensors configured to measure a characteristic;*

*one or more heaters configured to maintain a temperature of the object table;*

*a predictor configured to determine a quantity representative of the deformation of the part, the quantity determined based on the measured characteristic and on a model or relationship representing at least the varying load: and*

*a control system to control a heater of the one or more heaters based on an output from the one or more sensors and to control the movement of the object table in the at least one direction based on an output from the measurement system.*

*32. The object positioning system according to claim 35, wherein a sensor of the one or more sensors is configured to measure a characteristic of the two-phase flow, wherein the measured characteristic of the two-phase flow is used for determining the quantity representative of the deformation of the part.*

*33. The object positioning system according to claim 32, wherein the measured characteristic is at least one selected from: temperature of the two-phase flow, mass flow rate of the two-phase flow, and/or humidity of the two-phase flow.*

*34. The object positioning system according to claim 31, further comprising an actuator system with one or more actuators, wherein the control system is configured to control the actuator system to move the object table and the measurement system is configured to take measurements of the displacement of the object table to measure the movement of the object table.*

*35. The object positioning system according to claim 31, wherein the object table comprises a channel for the passage therethrough of a two-phase flow, wherein the two-phase flow through the channel causes a varying load to act on the object table.*

*36. The object positioning system according to claim 31, wherein the lithographic apparatus comprises a projection system, a substrate table and a support structure, wherein the projection system is configured to project a pattern on a patterning device onto a substrate, wherein the support structure is configured to hold the patterning device, wherein the substrate table is configured to hold the substrate, and wherein the object comprises the substrate and the object table comprises the substrate table or wherein the object comprises the patterning device and the object table comprises the support structure.*

*37. The object positioning system according to claim 31, wherein the control system is configured to control a characteristic of the lithographic apparatus based on the quantity representative of the deformation of the part.*

*38. The object positioning system according to claim 37, wherein the control system is configured to control a characteristic of the object table based on the quantity representative of the deformation of the part.*

*39. The object positioning system according to claim 37, wherein the control system is configured to control a heater of the one or more heaters based on the quantity representative of the deformation of the part.*

*40. A lithographic apparatus comprising:*

*the object positioning system according to claim 31; and*

*a liquid supply system configured to supply a liquid to a space between a projection system and the object table.*

* * * * *